(12) United States Patent  (10) Patent No.: US 7,820,998 B2
Finkelstein et al.  (45) Date of Patent: Oct. 26, 2010

(54) DEVICE AND METHOD FOR MANIPULATING DIRECTION OF MOTION OF CURRENT CARRIERS

(75) Inventors: Alexander Finkelstein, Rehovot (IL); Maxim Khodas, Rehovot (IL); Arcadi Shehter, Rehovot (IL)

(73) Assignee: Yeda Research and Development Ltd., Rehovot (IL)

( * ) Notice: Subject to any disclaimer, the term of this patent is extended or adjusted under 35 U.S.C. 154(b) by 913 days.

(21) Appl. No.: 10/585,582

(22) PCT Filed: Jan. 9, 2005

(86) PCT No.: PCT/IL2005/000026

§ 371 (c)(1),
(2), (4) Date: Jul. 10, 2006

(87) PCT Pub. No.: WO2005/065037

PCT Pub. Date: Jul. 21, 2005

(65) Prior Publication Data

US 2007/0210298 A1  Sep. 13, 2007

Related U.S. Application Data

(60) Provisional application No. 60/534,708, filed on Jan. 8, 2004.

(51) Int. Cl.
*H01L 29/12*  (2006.01)
(52) U.S. Cl. .................................... 257/9; 257/E29.076
(58) Field of Classification Search .......... 257/E29.076, 257/9
See application file for complete search history.

(56) References Cited

U.S. PATENT DOCUMENTS 5,001,437 A * 3/1991 Miyata et al. ............... 315/501

(Continued)

OTHER PUBLICATIONS

Chen et al. "Spin polarized reflection of electrons in a two-dimensional electron system," http://xxx.lanl.gov/abs/cond-mat/0308569 (Aug. 27, 2003.*

(Continued)

*Primary Examiner*—Davienne Monbleau
*Assistant Examiner*—Matthew Reames
(74) *Attorney, Agent, or Firm*—Browdy and Neimark, PLLC

(57) ABSTRACT

A device and method for manipulating a direction of motion of current carriers are presented. The device comprises a structure containing a two-dimensional gas of current carriers configured to define at least one region of inhomogeneity which is characterized by a substantially varying value of at least one parameter from the following: a spin-orbit coupling constant, density of the spin carriers, and a mobility of the gas. The device may be configured and operable to perform spin manipulation of a flux of the spin carrying current carriers to provide at least one of the following types of deviation of said spin-carrying current carriers: spin dependent refraction, spin dependent reflection and spin dependent diffraction on desired deviation angles of a direction of motion of the spin-carrying current carriers being incident on said at least one region of inhomogeneity. The device may also be configured and operable to allow emission of the current carriers from a diffusive region at one side of the region of inhomogeneity to a ballistic region at the opposite side of the region of inhomogeneity to provide the current carriers propagation in multiple directions in the ballistic region with a wide angular range of these directions.

39 Claims, 24 Drawing Sheets

U.S. PATENT DOCUMENTS

| | | | |
|---|---|---|---|
| 6,333,516 B1 * | 12/2001 | Katoh et al. | 257/22 |
| 6,355,953 B1 | 3/2002 | Kirczenow | |
| 2001/0010358 A1 * | 8/2001 | Kaneyama | 250/311 |
| 2003/0075772 A1 | 4/2003 | Efros et al. | |

OTHER PUBLICATIONS

S. A. Wolf et al., "Spintronics: A Spin-Based Electronics Vision for the Future", *Science*, vol. 294, pp. 1488-1495, Nov. 16, 2001.

H. Ohno et al., "Semiconductor Spin Electronics", *JSAP International*, Mo. 5, pp. 4-13, Jan. 2002.

Gary Prinz, "Magnetoelectronics", *Science*, vol. 282, pp. 1660-1663, Nov. 27, 1998.

Mark Johnson et al., "Interfacial Charge-Spin Coupling: Injection and Detection of Spin Magnetization in Metals", vol. 55, No. 17, pp. 1790-1793, Oct. 21, 1985.

R. Fiederling et al., "Injection and Detection of a spin-polarized current in a light-emitting diode", *Nature*, vol. 402, pp. 787-789, Dec. 16, 1999.

Y. Ohno et al., "Electrical spin injection in a ferromagnetic semiconductor heterostructure". *Nature*, vol. 402, pp. 790-792, Dec. 16, 1999.

Vladimir Ya. Kravcheno et al., "Spin inection into a ballistic semiconductor microstructure", *Physical Review B*, vol. 67, pp. 121310-1-121310-4, 2003.

G. F. Dresselhaus, "Spin-Orbit Coupling Effects in Zinc Blende Structures", *Physical Review*, vol. 100, No. 2, pp. 580-586, Oct. 15, 1955.

E. I. Rashba, *"Properties of Semiconductors with an Extremum Loop I. Cyclotron and Combinatorial Resonance in a Magnetic Field Perpendicular to the Plane of the Loop"*, Soviet Physics—Solid State, vol. 2, pp. 1109-1122, Jun. 1960.

Yu A. Bychkov et al., "Oscillatory effects and the magnetic susceptibility of carriers in inversion layers", *J. Phys. C. Solid State Phys.*, vol. 17, pp. 6039-6045, 1984.

J. Luo et al., "Effects of inversion asymmetry on electron energy band structures in GaSb/InAs/GaSb quantum wells", *Phys. Review B*, vol. 41, No. 11, pp. 7685-7693, Apr. 15, 1990.

Simon M. Sze, "Semiconductor Devices: Physics and Technology", *Wiley Text Books*, $2^{nd}$ Edition, pp. 246-253 and 332-368, Sep. 2001.

Y. Sato et al., "Large spontaneous spin splitting in gate-controlled two-dimensional electron gases at normal $In_{0.75}Ga_{0.25}As/In_{0.75}Al_{0.25}As$ heterojunctions". *Journal of Applied Physics*, vol. 89, No. 12 pp. 8017-8021, Jun. 15, 2001.

P. M. Morse et al., *"Methods of Theoretical Physics I"*, Chapter 12.2 Distribution Functions for Diffusion Problems, pp. 1606-1638, Jun. 1953.

Igor Zutic et al., "Spintronics: Fundamentals and applications", *Review of Modern Physics*, vol. 76, pp. 323-410, Apr. 2004.

A. A. Kiselev et al., "T-shaped spin filter with a ring resonator", *Journal of Applied Physics*, vol. 94, No. 6, pp. 4001-4005, Sep. 15, 2003.

A. A. Kiselev et al., "T-shaped ballistic spin filter", *Applied Physics Letters*, vol. 78, No. 6, pp. 775-777, Feb. 5, 2001.

Sanker Das. Sarma, "Spintronics", *American Scientist*, vol. 89, pp. 516, Nov. 2001.

I. I. Rabi, "Space Quantization in a Gyrating Magnetic Field", *Physical Review*, vol. 51, pp. 652-654, Apr. 15, 1937.

J. Spector et al., "Control of ballistic electrons in macroscopic two-dimensional electron systems", *Appl. Phys. Letters*, vol. 56, No. 10, pp. 967-969, Mar. 5, 1990.

L. W. Molenkamp et al., "Electron-beam collimation with a quantum point contact", *Physical Review B*, vol. 41, No. 2, pp. 1274-1277, Jan. 15, 1990.

Yu A. Bychkov et al., "Properties of a 2D electron gas with lifted spectral degeneracy", *JETP Letters*, vol. 39, No. 2, pp. 78-81, Jan. 25, 1984.

S. Datta et al., "Electronic analog of the electro-optic modulator", *Applied Physics Letters*, vol. 56, No. 7, pp. 665-667, Feb. 12, 1990.

J. Luo et al., "Observation of the zero-field spin splitting of the ground electron subband in GaSb-In-As-GaSb quantum wells", *Physical Review B*, vol. 38, No. 14, pp. 10142-10145, Nov. 15, 1988.

B. Das et al., "Evidence for spin-splitting in $In_xGa_{1-x}As/In_{0.52}Al_{0.48}As$ heterostructures as B→0", *Physical Review B*, vol. 39, No. 2, pp. 1411-1414, Jan. 15, 1989.

J. Nitta et al., "Gate Control of Spin-Orbit Interaction in an Inverted $In_{0.53}Ga_{0.47}As/In_{0.52}Al_{0.48}As$ Heterostructure", *Physical Review Letters*, vol. 78, No. 7, pp. 1335-1338, Feb. 17, 1997.

G. Engels et al., "Experimental and theoretical approach to spin splitting in modulation-doped $InxGa_{1-x}As/InP$ quantum wells for B→0", *Physical Review B*, vol. 55, No. 4, pp. R1958-R1961, Jan. 15, 1997.

S. J. Papadakis et al., "Spin-splitting in GaAs two-dimensional holes", *Physica E*, vol. 9, pp. 31-39, 2001.

* cited by examiner

DEVICE AND METHOD FOR MANIPULATING DIRECTION OF MOTION OF CURRENT CARRIERS

FIELD OF THE INVENTION

This invention relates to a nanoscopic device and a method for manipulating the direction of motion of current carrying particles, and may be useful for polarizing, filtering, switching, guiding, storing, spin detecting and focusing the particles, as well as for signal splitting and wide-angle sparging of current carriers.

REFERENCES

The following references are considered to be pertinent for the purpose of understanding the background of the present invention:

1. S. A. Wolf et al., *Science*, V.294, P. 1488 (2001).
2. I. Zutic, J. Fabian, S. Das Sarma, *Review of Modern Physics*, V.76, P. 323, (2004).
3. H. Ohno et al., JSAP *International*, No. 5, P. 4 (January 2002).
4. G. A. Prinz, *Science*, V.282, P. 1660 (1998).
5. U.S. Pat. No. 6,355,953 to Kirczenow.
6. U.S. Patent Application Publication No. 2003/0075772 to Efros et al.
7. M. Johnson et al., *Phys. Rev. Lett.* V.55, P. 1790 (1985).
8. R. Fiederling et al., *Nature*, V.402, P. 787 (1999).
9. Y Ohno et al., *Nature*, V.402, P. 790 (1999).
10. V. Ya. Kravchenko and E. I. Rashba, *Phys. Rev.* B V. 67, P. 121310 (2003)
11. P. M. Morse and H. Feshbach, *Methods of Theoretical Physics* (McGraw-Hill, New York, 1953).

BACKGROUND OF THE INVENTION

Spin manipulation is used in spintronics, or spin electronics, which term refers to the technology that offers opportunities for a new generation of devices that exploit electron spin information, rather than charge. Spins, being the attribute of mobile electrons, can carry the information along the conductive line. In turn, the information can be read afterwards.

Spin orientation of conduction electrons survives for a relatively long time (e.g., nanoseconds). This feature makes spintronic devices particularly attractive for memory storage, magnetic sensor applications, and eventually for quantum information processing and quantum computation where electron spin would represent a bit (usually referred to as a "qubit") of information [1-4].

Spintronic devices are already in use in industry as a read head and a memory-storage cell. For example, the read head is the giant-magnetoresistive (GMR) sandwich structure that includes alternating ferromagnetic and nonmagnetic metal layers [4]. Depending on the relative orientation of the magnetization in the magnetic layers, the device resistance changes from small (parallel magnetizations) to large (anti-parallel magnetizations). This change in resistance is used to sense changes in magnetic fields. Another example of the spintronic application is related to tunneling magneto resistance (CMR) and magnetic tunnel junction (MTJ) devices where the tunneling current depends on spin orientations of the electrodes. A typical MFJ device includes two magnetic layers separated by an insulating metal-oxide layer. Electrons can "tunnel" through from one layer to the other, only when magnetizations of the layers point in the same direction, otherwise, the resistance is high.

One of the approaches of the current efforts in designing and manufacturing spintronic devices involves developing new materials and structures that exhibit a high level of spin polarization of spin carriers. Most efforts in this approach are currently concentrated on ferromagnetic semiconductors and combinations of semiconductors and ferromagnetic metals [4-6]. The central idea of the prior art techniques is to polarize electrons using ferromagnetic semiconductors, or one of the novel composite magnetic structures, with the subsequent injection of the polarized electrons into a semiconductor device for further applications [1-6].

It is possible, in principle, to create a spin-polarized current in a non-ferromagnetic material by creating a spin-polarized electron current in a ferromagnetic material and causing the current to flow from the ferromagnetic material into an adjacent non-ferromagnetic material by way of an interface. Spin-polarized electron transport has been achieved in this manner for example, from ferromagnetic metals into normal metals [7] and from magnetic semiconductors into non-magnetic semiconductors (see [8], [9]).

The difficulties of the technology of the injection of the spin polarized electrons into a semiconductor system have a general character. The spin injection from a ferromagnetic metal into a semiconductor structure is strongly suppressed [10]. One of the suggestions of how to overcome these difficulties is described in [5]. A method and apparatus which create a spin filter at an interface between a semiconductor and a ferromagnetic material has been suggested. The spin filter can be used to provide a current of spin-polarized charge carriers in the semiconductor. The spintronic device comprises a crystalline first semiconductor; and a crystalline ferromagnetic material in atomic registration with the first semiconductor at an interface. The semiconductor and ferromagnetic material were chosen so that transmission of current carriers in a first spin state from the ferromagnetic material into the first semiconductor is quantum mechanically forbidden, while the transmission of current carriers in a second spin state from the ferromagnetic material into the first semiconductor is quantum mechanically permitted.

GENERAL DESCRIPTION OF THE INVENTION

There is a need in the art for, and it would be useful to have, a novel technique enabling various types of manipulation of a direction of motion of current-carrying particles (electrons and/or holes), such as spin-dependent manipulating (including splitting the current of spin-unpolarized current carrying particles into fluxes of particles of different spin polarizations propagating in different directions, and redirection of the current of spin-polarized current carries), or splitting the current into multiple directions (which may or may not involve spin polarization of the current carriers).

The current carrying particles, including electrons and/or holes, are termed in the description below as "current carriers". The directional motion of such carriers is termed "current" or "flux". The term "spin carriers" is used herein below when spin manipulations of spin carrying current carriers are described. As indicated above, spin manipulation is used in spintronics, or spin electronics, which term refers to the technology that offers opportunities for a new generation of devices that exploit electron spin information, rather than charge.

It would be advantageous to have a device and method of manipulation of the current carriers that would exploit materials that are common for the semiconductor industry. In the case when the current is manipulated using the spin of the current carries, it would be advantageous to provide a novel way to generate and manipulate a spin-polarized current by using known semiconductor materials that are traditional for the mass-production semiconductor industry.

It should be noted that the term "semiconductor industry" actually refers to the industry of integrated devices (utilizing lithography-based techniques) and also nano-technology based devices.

The device of the present invention utilizes a structure containing a two-dimensional gas of current carriers (electron gas). The term "two-dimensional gas" utilized herein signifies the gas of current carriers (which are also spin carriers), confined to a three dimensional domain having an extension in two dimensions substantially greater than in the third dimension. Usually, the motion of the current carriers in the third direction is quantized by a potential well confining the gas of the current carriers. It should be noted that such potential wells are sometimes referred to in the art as quantum wells.

The structure configured according to the present invention contains a two-dimensional gas of current carriers having at least one region of inhomogeneity characterized by at least one substantially varying parameter from the following parameters: spin-orbit coupling constant, density of the current carriers (provided the spin-orbit coupling constant has a non-zero value) and mobility of the gas (determined by the concentration of scattering centers, such as impurities).

It should be understood that in this description any variation of the parameters of the gas and the structure in a direction parallel to the plane of the two-dimensional gas is termed "lateral variation". In particular, this pertains to lateral variation of the parameters of the two-dimensional gas and to lateral variation of the shape of the potential well.

It should be understood, that the spin-orbit interaction is a necessary component when the manipulation of current exploits the spin of the current carries. Generally, in the presence of spin-orbit interaction a region of inhomogeneity can produce spin-dependent redirection (deflection) of the trajectory of spin carriers incident onto said region of inhomogeneity.

Thus, according to one aspect of the invention, the invention provides for spin manipulation of the direction of motion of spin carriers. The device, according to this aspect of the invention, utilizes a structure containing a two-dimensional gas of current carriers (electron/hole gas) with a substantial spin-orbit interaction, the gas having at least one region of inhomogeneity characterized by at least one substantially varying parameter selected from spin-orbit coupling constant and density of the spin carriers. The structure is configured to provide a desired orientation between an input current (flux) of the spin carriers and the region of inhomogeneity. The device (termed "spintronic device") is thereby operable to perform spin manipulations of the input current to provide at least one of the following types of deviation of the spin carriers: spin dependent refraction, spin dependent reflection and spin dependent diffraction on desired deviation angles of a direction of motion of the spin carriers being incident on the region of inhomogeneity.

According to one embodiment, the structure is configured to create the region of inhomogeneity of the gas in the form of a transition region (zone) between two regions of the gas having different values of the spin-orbit coupling constant and/or the density of the spin carriers. The region of inhomogeneity in this case presents a lateral interface (with laterally varying parameters) between the two gas regions. Such a lateral interface may for example be of a curved geometry.

According to another embodiment, the structure is configured to create the region of inhomogeneity in the form of an elongated stripe which has a reduced or enhanced spin-orbit coupling constant and/or the density of the spin carriers as compared to the surroundings of the stripe in the gas. The stripe may be of curved geometry, for example in the form of an arc or closed-loop stripe. The configuration may be such that an input flux of spin carrier is directed to pass across the stripe or along the stripe.

According to yet another embodiment, the structure is configured to define the region of inhomogeneity formed by a lens-like geometry region of the gas having reduced or enhanced spin-orbit coupling constant and/or the density of the spin carriers as compared to that/those of the gas surroundings of this lens-like region of the gas.

According to still another embodiment of this aspect of the invention, the structure is configured to define in the gas with spin-orbit interaction regions of inhomogeneity arranged in a spin zone pattern. It should be understood that in the spin zone pattern the regions of inhomogeneity of the two-dimensional gas with the spin-orbit interaction can have vanishing density of the current carriers (these regions can for example be barriers) making the two-dimensional gas with the spin-orbit interaction to be a multiply connected domain.

According to another aspect of the invention, the invention provides for spreading the current carriers in an angular range of directions of propagation, obtained due to a diffuse emission effect. The structure, according to this aspect of the invention, is configured to create the region of inhomogeneity in the form of a lateral interface between first and second regions differing from each other in the gas mobility such that the first region is diffusive and the second region is ballistic. The structure thus provides for emitting the current carriers from the diffusive region into the ballistic region with a wide angular range of directions of propagation of the current carriers in the ballistic region. This allows for directing the current carriers at desired range of angles of propagation in the ballistic region.

According to some embodiments of the second aspect of the invention, such a structure may for example be configured to provide in the ballistic region different density of current carriers as compared to the diffusive region and/or enhanced or reduced spin-orbit coupling constant.

The device of the present invention thus provides for manipulating a direction of motion of the current carriers, injected in one region, to obtain a desired change in the direction of the carriers' motion in other region(s).

Thus, according to one broad aspect of the present invention, there is provided a device for manipulating a direction of motion of current carriers, the device comprising a structure containing a two-dimensional gas of the current carriers configured to define at least one region of inhomogeneity characterized by a substantially varying value of at least one parameter selected from a spin-orbit coupling constant, density of the spin carrying current carriers, and a mobility of the gas, the device having one of the following configurations:

(i) said structure is configured to provide the two-dimensional gas configuration with a desired orientation between an input flux of the spin carrying current carriers and said at least one region of inhomogeneity, which has the varying spin-orbit coupling constant and/or has the varying density of the spin carrying current carriers provided the spin-orbit coupling constant is of non-zero value, the device being thereby operable to perform spin manipulations of the input flux to provide at least one of the following types of deviation of said spin carrying current carriers: spin dependent refraction, spin dependent reflection and spin dependent diffraction on desired deviation angles of a direction of motion of the spin carrying current carriers being incident on said at least one region of inhomogeneity; and (ii) said structure is configured to create the region of inhomogeneity in the form of a lateral interface between first and second regions differing from each other at least in the gas mobility such that the first region is diffusive and the second region is ballistic, the device being thereby operable for emitting the current carriers from the diffusive region into the ballistic region with a wide angular range of directions of propagation of the current carriers in the ballistic region, thereby enabling directing the current carriers to one or more desired range of angles of propagation in the ballistic region.

The inhomogeneous two-dimensional gas may be confined by a non-uniform potential well (one or more). For example, the non-uniform potential well can be created in a laterally varying semiconductor structure. An example of the non-uniform potential well includes, but is not limited to, a potential well being asymmetric at least in one portion of the potential well. In particular, in one of the part of the semiconductor structure the potential well can be a symmetrical potential well, while in another portion it can be an asymmetrical potential well. Alternatively, the semiconductor structure at least in one part can have a potential well with the depth being different from the depth in the other part(s) of the structure.

Another example of the non-uniform potential well can be a potential well in a laterally varying semiconductor structure fabricated from a uniaxial crystal compound with no inversion symmetry in at least one part of the structure. In this case, the laterally varying semiconductor structure provides a different density of spin carriers (and/or different magnitude of the spin-orbit coupling constant) at least in one region of the inhomogeneous two-dimensional gas of spin carriers.

In the following, a term "varying spin-orbit density" or "variation of spin-orbit density" will be used to refer to either the variation of spin-orbit coupling constant, or variation of density of the spin carriers, provided the spin-orbit coupling constant has a non-zero value, or to refer to both of these situations. Examples of such a region of inhomogeneity with the varying spin-orbit density include but are not limited to: a lateral interface between two regions of the gas with different spin-orbit densities; and a region of the gas of relatively reduced or relatively enhanced spin-orbit density as compared to the gas surroundings of this region.

It should be understood that the regions of inhomogeneity of the gas can be of a desired size and can form a desired pattern. Moreover, the regions of inhomogeneity can have a required spatial orientation and profiles of the density and spin-orbit coupling constant.

The potential well may be created in a semiconductor heterostructure. Examples of the semiconductor structure suitable to be used for manipulation of spin carriers' motion include, but are not limited to, semiconductor heterostructures fabricated from group III-group V and group II-group VI compounds. Examples of the semiconductor multilayer heterostructures fabricated from group III-group V compounds include, but are not limited to $In_xGa_{1-x}As/In_yAl_{1-y}As$, $In_xGa_{1-x}As/InP$, $InAs/AlSb$, $In_xAl_{1-x}As/In_yGa_{1-y}As/In_z Al_{1-z}As$, etc., wherein x, y and z are in the range of 0.1 to 1. In turn, examples of the semiconductor heterostructures fabricated from group II-group VI compounds include, but are not limited to $CdTe/HgTe/CdTe$, $Hg_xCd_{1-x}Te$ etc., wherein x is in the range of about 0.1 to 1. As for the structure appropriate for defining a configuration of diffusive-ballistic regions in the two-dimensional gas, semiconductor heterostructures fabricated from Si, Ge, group IV-group IV, as well as group III-group V and group II-group VI compounds can be used.

The device can comprise one or more gates, i.e., a conducting layer of any appropriate shape and size and affecting the inhomogeneous two-dimensional gas of the spin carriers. For example, a bias voltage can be applied to the gate that should be sufficient to affect the gas of the spin carriers in the regions of the gas near the gate. Thus, the varying of the spin-orbit density (i.e., changing of the magnitude of the spin-orbit coupling constant and/or density of the spin carriers) can be achieved by a controllable altering of the bias voltage.

The device can have terminals distant from each other. Each terminal is defined by a space between two nearest barriers arranged in the inhomogeneous two-dimensional gas, so as to allow a current passage between the terminals.

The inhomogeneous two-dimensional gas of the spin carriers may for example be obtained by fabrication of a laterally varying semiconductor structure by means of known per se lithography, etching, deposition and/or implantation techniques. According to another example, the inhomogeneous two-dimensional gas of the spin carriers can be obtained by applying a bias voltage to a gate electrode (one or more). The bias voltage affects the gas in the region near the gate creating a variation of the spin-orbit density, thereby making the two-dimensional gas of the spin carriers inhomogeneous. The techniques suitable to locally alter electron gas mobility include, but are not limited to, electron beam irradiation, ion beam irradiation and implantation, local shallow etching (by wet etching, plasma etching or focused ion beam etching), local deposition or any combination thereof. Likewise, the barriers can be formed in the gas by the gates, and/or by using lithography, etching, deposition, implantation, or any other suitable technique.

It should be understood, that when required, a combination of the above techniques can be applied for creating the inhomogeneous two-dimensional gas of the spin carriers.

In the present invention the device can be configured in several embodiments to provide various types of manipulation of the direction of motion of the current carriers.

One of the terminals may be an injector terminal providing a current of unpolarized spin carriers for spin polarizing, and at least one other terminal is a collector terminal configured for receiving a current of spin-polarized spin carriers. The device can thus be used as a spin filter for producing a spin current of spin carriers having a predetermined spin polarization. It should be understood that the term "spin polarization" used herein refers to the current carrier state with certain chirality. It should be understood that the spin carriers received by a collector terminal can be used for subsequent spin manipulations.

The device may include one or more terminals and a charge sensor associated with the collecting terminal(s). The terminal(s) are configured for receiving a current of spin carriers having predetermined spin polarization. The device can thus be operable as a spin detector for detecting a spin polarization of the spin carriers.

The region of inhomogeneity of the gas can be configured for spin focusing of the spin carriers. The spin focusing can be realized by arranging the region of inhomogeneity in a concave/convex shape. Another option for spin focusing is creating a spin zone device by arranging regions of inhomogeneity in a spin zone pattern. It should be understood that in the spin zone pattern the regions of inhomogeneity of the two-dimensional gas with the spin-orbit interaction can have vanishing density of the current carriers (these regions can for example be barriers) making the two-dimensional gas with the spin-orbit interaction to be a multiply connected domain.

The spin zone device exploits the spin dependent diffraction of spin carriers on a spin zone pattern.

The regions of inhomogeneity of the gas can be configured for guiding the spin current of spin polarized spin carriers along this region owing to the total internal reflection of the spin carriers. The device can thus be used as a spin-guide configured for conveying the spin current to a predetermined place in the two-dimensional gas, thus to operate as a spin guide.

Furthermore, the spin-guide can be configured in the shape of a closed loop (e.g., ring) having an entrance and at least one exit, thereby to provide a spin-storage device of the spin carriers. By applying an appropriate voltage to the gate, and thereby opening the exit, one can get a pulse of the spin polarized current carriers electrons.

The device can comprise a gate affecting the gas of the spin carriers and configured for varying the spin-orbit density in the corresponding region of the two-dimensional gas of spin carriers. Thus, the altering of the bias voltage applied to the gate can switch the deviation angle of the spin carriers between different predetermined ranges of angles. This spintronic device can be used as a spin-switch device and/or transistor.

It should be noted that the time needed for switching the current in the above-described switch device can advantageously be made very short, thereby making the device extremely fast.

The device of the present invention configured to have the diffusive and ballistic regions can be operable as a wide-range-angle sparger. Such a sparger can be used as an element for constructing a signal splitter for replicating an input signal. Moreover, the diffuse emission effect used in the device provides for directing current carriers in a predetermined range of angles, which can be used for spin filtration (in this case the ballistic region differs from the diffusive region at least in the spin-orbit density). The device includes one or more collector terminal configured to receive one or more carriers' fluxes, respectively, emitted to desired range of directions, or configured to receive current carriers with predetermined spin polarization(s).

According to another broad aspect of the present invention, there is provided a method for spin manipulation of a current of spin carrying current carriers, the method comprising: providing an input flux of the spin carrying current carriers in a two-dimensional gas of the spin carriers configured to define at least one region of inhomogeneity which is characterized by a substantially varying spin-orbit coupling constant or characterized by a substantially varying density of the carriers provided the spin-orbit coupling constant is of non-zero value; and providing a desired orientation between the input flux of the carriers and said at least one region of inhomogeneity; the method thereby providing at least one of the following types of deviation of the carriers: spin dependent refraction, spin dependent reflection and spin dependent diffraction on desired deviation angles of a direction of motion of the carriers being incident on said at least one region of inhomogeneity of the gas.

The desired orientation is such that the current of the spin carries contains spins carriers that impinges on the region of inhomogeneity at a certain range of non-zero angles of incidence.

According to one embodiment of the invention, the manipulation of the current of spin carriers includes a spin polarizing of the current, thereby providing a flux of spin-polarized spin carriers. According to another embodiment of the invention, the manipulation of the current of spin carriers includes filtering the current of spin carriers, thereby providing a flux of spin carriers having a predetermined spin polarization in which all spins have mostly the same orientation.

It should be understood, that when required, a combination of the foregoing techniques can be applied for creating the inhomogeneous two-dimensional gas of the spin carriers.

It should be further understood that the regions of inhomogeneity of the gas can be of a desired size and can form a desired pattern. Moreover, the regions of inhomogeneity can have a required spatial orientation and profiles of the density and spin-orbit coupling constant.

It should be noted that the method of manipulation of current of spin carriers of the present invention utilizes the effect of spin splitting of the energy spectrum of spin carriers which exists in the presence of the spin-orbit interaction. According to one example, the spin-orbit interaction can exist when the potential well, confining the two-dimensional gas of spin carriers, is asymmetric in the direction perpendicular to the plane of the gas (the structure inversion asymmetry, i.e., the Rashba mechanism). According to another example, the spin-orbit interaction can exist when at least one part of the semiconductor structure hosting the inhomogeneous two-dimensional gas of spin carriers is fabricated from a uniaxial crystal compound with no inversion symmetry (bulk inversion asymmetry, i.e., the Dresselhaus mechanism).

For instance, the spin-orbit interaction can be observed in narrow-gap semiconductors. It should be noted that the technique of the present invention advantageously utilize the conventional semiconductor materials for the manipulation of a direction of motion of the spin carrying current carriers while not needing any magnetic means (e.g., magnetic materials).

The direction of motion of the deviated spin carriers as well as their spin polarization can be controlled by changing, inter alia, a spin-orbit density, and/or the angle at which the spin carriers are incident on the region of inhomogeneity of the gas.

For example, the changing of the magnitude of the spin-orbit coupling constant and/or density of the spin carriers can be achieved by a controllable altering of the bias voltage applied to the gate(s) arranged near the two-dimensional gas of spin carriers. The magnitude of the bias voltage should be sufficient to create a variation of the spin-orbit density. It should be understood that the same gate(s) may be used for both the creation of the inhomogeneous two-dimensional gas of the spin carriers and for controlling the spin manipulation, or these can be different gate(s). Hence, the spin dependent deviation of angle of motion can be controlled by the magnitude of the bias voltage applied to the gate.

Thus, according to an embodiment of the invention, the manipulation of the current of spin carriers includes a controllable switching of the deviation angles of a direction of motion of the spin carriers between different predetermined ranges of angles. As indicated above, the time needed for switching the current can be made extremely short.

According to yet another embodiment of the invention the manipulation of the current of the spin carriers includes a spin-guiding of the current of polarized spin carriers owing to the total internal reflection of the spin carriers for conveying the spin current to a predetermined place in the two-dimensional gas of the spin carriers.

According to still another embodiment of the invention, the manipulation of the current of the spin carriers includes spin focusing the spin carriers. The spin focusing can be realized by arranging an area of inhomogeneity having either concave or convex shape (pattern). Likewise, the spin focusing can be provided by creating a spin zone device (analogous to the zone plate lens used in optics).

According to yet another broad aspect of the invention, there is provided a method for manipulation of a direction of motion of current carriers to provide for signal splitting, the method comprising: operating a structure, containing a two-dimensional gas of said carriers and configured to define first and second adjacent regions one being diffusive and the other being ballistic, allowing for emitting the current carriers from the diffusive region into the ballistic region with a wide angular range of directions of propagation of the current carriers in the ballistic region; and collecting the current carriers propagating in the ballistic region within one or more desired range of angles of propagation.

According to yet another broad aspects of the invention, there are provided methods of fabrication of a spintronic device for spin manipulation of a current of spin carrying current carriers.

One of these methods comprises: fabricating a structure containing a two-dimensional gas of spin carrying current carriers configured to define at least one region of inhomogeneity, which is characterized by a substantially varying magnitude of a spin-orbit coupling constant or is characterized by a substantially varying density of the spin carrying current carriers provided the spin-orbit coupling constant is of non-zero value, and to define a desired orientation between an input flux of the spin carrying current carriers in the gas and said at least one region of inhomogeneity of the gas; thereby enabling spin manipulations of said flux of the spin carrying current carriers to provide at least one of the following types of deviation of said spin carrying current carriers: spin dependent refraction, spin dependent reflection and spin dependent diffraction on desired deviation angles of a direction of motion of the spin carrying current carriers being incident on said at least one region of inhomogeneity of the gas.

Another method comprises: providing a structure containing a two-dimensional gas of spin carrying current carriers; arranging at least one gate configured for allowing application of a bias voltage thereto sufficient to affect the two-dimensional gas of the spin carrying current carriers in a region near the gate to thereby enable creation of at least one region of inhomogeneity of the gas which is characterized by a substantially varying magnitude of a spin-orbit coupling constant or is characterized by a substantially varying density of the spin carrying current carriers provided the spin-orbit coupling constant is of non-zero value, and enable to define a desired orientation between an input flux of the spin carrying current carriers in the gas and said at least one region of inhomogeneity of the gas, to thereby provide at least one of the following types of deviation of the spin carrying current carriers: spin dependent refraction, spin dependent reflection and spin dependent diffraction on desired deviation angles of a direction of motion of the spin carrying current carriers being incident on said at least one region of inhomogeneity of the gas.

According to yet another broad aspect of the invention, there is provided a method of fabrication of a device for manipulation of a direction of motion of current carriers operable as a signal splitter, the method comprising providing a structure containing a two-dimensional gas of current carriers and configured to define at least one region of inhomogeneity in the form of a lateral interface between first and second regions of the structure differing from each other at least in a mobility of the gas such that the first region is diffusive and the second region is ballistic; thereby allowing for emitting the current carriers from the diffusive region into the ballistic region with a wide angular range of directions of propagation of the current carriers in the ballistic region.

There has thus been outlined, rather broadly, the more important features of the invention so that the detailed description that follows hereinafter may be better understood. Additional details and advantages of the invention will be set forth in the detailed description, and in part will be appreciated from the description, or may be learned by practice of the invention

BRIEF DESCRIPTION OF THE DRAWINGS

In order to understand the invention and to see how it may be carried out in practice, preferred embodiments will now be described, by way of non-limiting examples only, with reference to the accompanying drawings, in which.

DETAILED DESCRIPTION OF THE INVENTION

Figure 1:
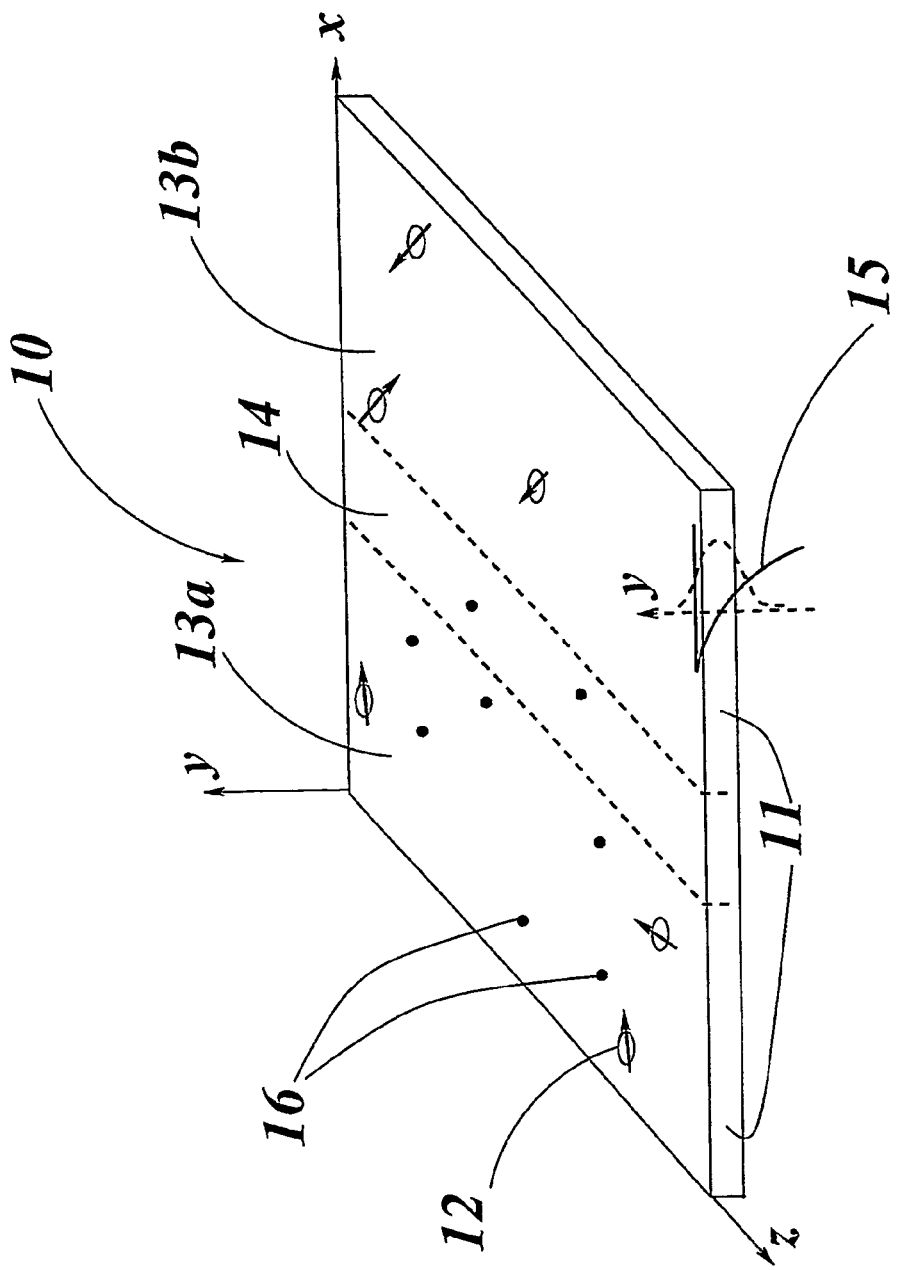
FIG. 1 is a schematic illustration (in an enlarged scale) of a configuration of a two-dimensional gas, suitable to be used in a device for manipulation of motion of current carriers of the present invention, such as a spintronic device or a signal splitter.

The principles and operation of the method according to the invention and the device based thereon may be better understood with reference to the drawings and the accompanying description. It is understood that these drawings and the examples of the properties of the device are given for illustrative purposes only and are not meant to be limiting. In particular, the spin-polarization (chirality) of spin carriers in the drawings discussed hereinbelow is illustrated in the assumption that the dominant mechanism of the spin splitting of the energy spectrum is the Rashba spin-orbit interaction. However, it should be appreciated that this presentation does not limit generality of the description. The present invention can be applied for other sources of the spin splitting as well. Furthermore, there is no intention to bind the invention by any theory presented in the description.

The technique of the present invention provides for manipulating a direction of motion of current carrying particles. Such a manipulation includes a redirecting (deflecting) the spin carrying current carriers according to their spin polarization (chirality "+" or "−") which provides for splitting of a flux of unpolarized spin carrying current carriers into two angularly resolved fluxes of current carriers according to their chirality; or spreading the flux of the current carriers in a wide angular range of direction of motion thereby providing for splitting the signal into multiple channels.

Referring to FIG. 1, there is schematically illustrated a configuration of a two-dimensional gas 11 of current carriers 12 (electrons or holes). For purposes of clarity, in the following description electrons will be considered as an example of spin carriers. The gas 11 is configured according to the invention for use in a device for manipulating the direction of motion of current carrying particles 12. It should be noted that this figure is not to scale, and is not in proportion, for purposes of clarity. The two-dimensional gas 11 of current carriers is confined in a potential well 15 (usually referred to as quantum well). The gas 11 of current carriers confined in the quantum well is called the two-dimensional gas, because the motion of carriers in the direction perpendicular to the plane of two-dimensional gas (being quantized) is quenched.

The gas 11 is, inhomogeneous having at least one region of inhomogeneity 14 which has at least one parameter varying in the direction parallel to the plane of the two-dimensional gas, the parameter selected from the following parameters: magnitude of a spin-orbit coupling constant (which may or may not depend on the density of the current carriers of the two-dimensional gas), the density of the current carriers of the two-dimensional gas, and mobility of the gas. The latter is determined by scattering centers (impurities or other defects shown by dots 16) in the semiconductor structure. In the present example of FIG. 1, the region of inhomogeneity 14 is a transition region (zone) between two regions 13a and 13b of the inhomogeneous gas 11 of the current carriers, which differ from each other in the value of spin-orbit coupling constant and/or density of the gas and/or mobility of the gas, and are in electrical contact with each other. Such region of inhomogeneity 14 constitutes a lateral interface in the gas.

As shown in FIG. 1, one of the gas regions—e.g., region 13a, may be a region with a relatively low mobility of the gas (diffusive region). This can be achieved by configuring the semiconductor structure containing the gas 11 such that the concentration of scattering centers in the region 13a is relatively high. The other region 13b of the gas is ballistic (clean) region and is characterized by relatively high mobility of the gas. The ballistic region may be spin-orbit (SO) region (i.e., a region of a substantial value of spin-orbit coupling constant), or it may be normal (N) region that is defined as a region with a reduced value of the spin-orbit coupling constant (compared to SO-region) or with no spin-orbit term. In some embodiments of the invention, the different regions at opposite sides of the lateral interface 14 are normal and spin-orbit regions, both being ballistic. Various examples of different embodiments of the invention will be described further below.

It should be understood that the lateral interface is one particular example of the region of inhomogeneity of the two-dimensional gas 11.

It should be noted that the term "interface" always refers in the present description to the lateral interface between the two regions of the inhomogeneous two-dimensional gas of current carriers.

According to the invention, the injection of the current (directional motion of current carriers 12) from one region to the other region through the interface 14 results in a change in the direction of motion of current carriers.

The invention, according to its one aspect, exploits the effect of spin splitting of the energy spectrum of current carriers which exists in the absence of inversion symmetry to provide a spin dependent refraction and/or spin dependent reflection of the spin carrying current carriers (termed also "spin carriers") at the region of inhomogeneity. The region of inhomogeneity in this case is characterized by a by a substantial variation in the direction parallel to the plane of the two-dimensional gas of the magnitude of a spin-orbit coupling constant and/or density of the spin carriers. This provides for spin manipulation of the current carriers.

In the other aspect, the invention provides spreading of the current carriers in a wide angular range of direction of motion. The region of inhomogeneity in this case is a transition region of the two-dimensional gas characterized by a substantial variation of mobility of the two-dimensional gas of current carriers in the direction parallel to the plane of the two-dimensional gas of the spin carriers. In this case, lateral interface 14 is a transition region between the first diffusive region of the gas 13a with a relatively low mobility of the gas (relatively high concentration of impurities) and the second ballistic region of the gas 13b (substantially free of impurities). In addition, each of the regions 13a and 13b may or may not be a spin-orbit (SO) region.

Thus, according to the first aspect of invention, the two-dimensional gas may be configured and operated for use in a spintronic device for spin manipulation. The following is the description of some examples of the invention providing the manipulation of the direction of motion of spin-carrying current carriers, based on the effect of spin splitting of the energy spectrum of current carriers.

The effect of spin splitting of the energy spectrum of spin carriers which exists in the absence of inversion symmetry can be achieved by using one of the known mechanisms of the spin-orbit interaction, which are described for example in the following publications: G. F. Dresselhaus *Phys. Rev.* V.100, P. 580, 1955; E. I. Rashba, *Sov. Phys—Solid State*, 1960, V 2, P. 1109; Yu. A. Bychkov and E. I. Rashba, *J. Phys. C*, 1984, V.17, P. 6039; and J. Luo et al., *Phys. Rev.*, 1990, V. B 41, P. 7685. One mechanism of the spin-orbit interaction, known as the Dresselhauss effect, is due to the lack of inversion symmetry of the host material. Another mechanism is related to the asymmetry of the potential confining the so-called two-dimensional carriers in semiconductor heterostructures. The latter mechanism is known as the Rashba spin-orbit interaction that is especially important for the heterostructures which are fabricated from narrow-gap semiconductor materials.

The Rashba term of the spin-orbit interaction has been intensively studied recently, both experimentally and theoretically. The potential well in the case of Rashba spin-orbit interaction has an asymmetrical shape. For example, this asymmetrical potential can be triangle. However, any asymmetry in the shape of the confining potential (including a rectangular potential well with confining potential barriers of different height) can provide a spin splitting of the energy spectrum. The lack of inversion symmetry of the confining potential leads to the Rashba spin-orbit interaction that is specific for heterostructures.

It should be noted that most of semiconductor heterostructures are fabricated from uniaxial crystal compounds with no inversion symmetry. Therefore, a combination of both mechanisms, the Dresselhauss and Rashba, can be acting in a two-dimensional gas created in the heterostructures.

In the description below, regardless of the mechanisms of the spin-orbit interaction responsible for spin splitting of energy spectrum of spin carriers, the resulting effect will be referred to as an effect of the spin-orbit interaction, which is characterized by a spin-orbit coupling constant. As indicated above, the varying spin-orbit density constitutes varying spin-orbit coupling constant, or varying density of the spin carriers provided that the spin-orbit coupling constant has a non-zero value, or a combination of both. Generally, a region of inhomogeneity with varying spin-orbit density can produce redirection of the trajectory of spin carriers of one polarization, thereby allowing for separating the trajectories of the spin carriers with different spin polarizations.

Figure 2:
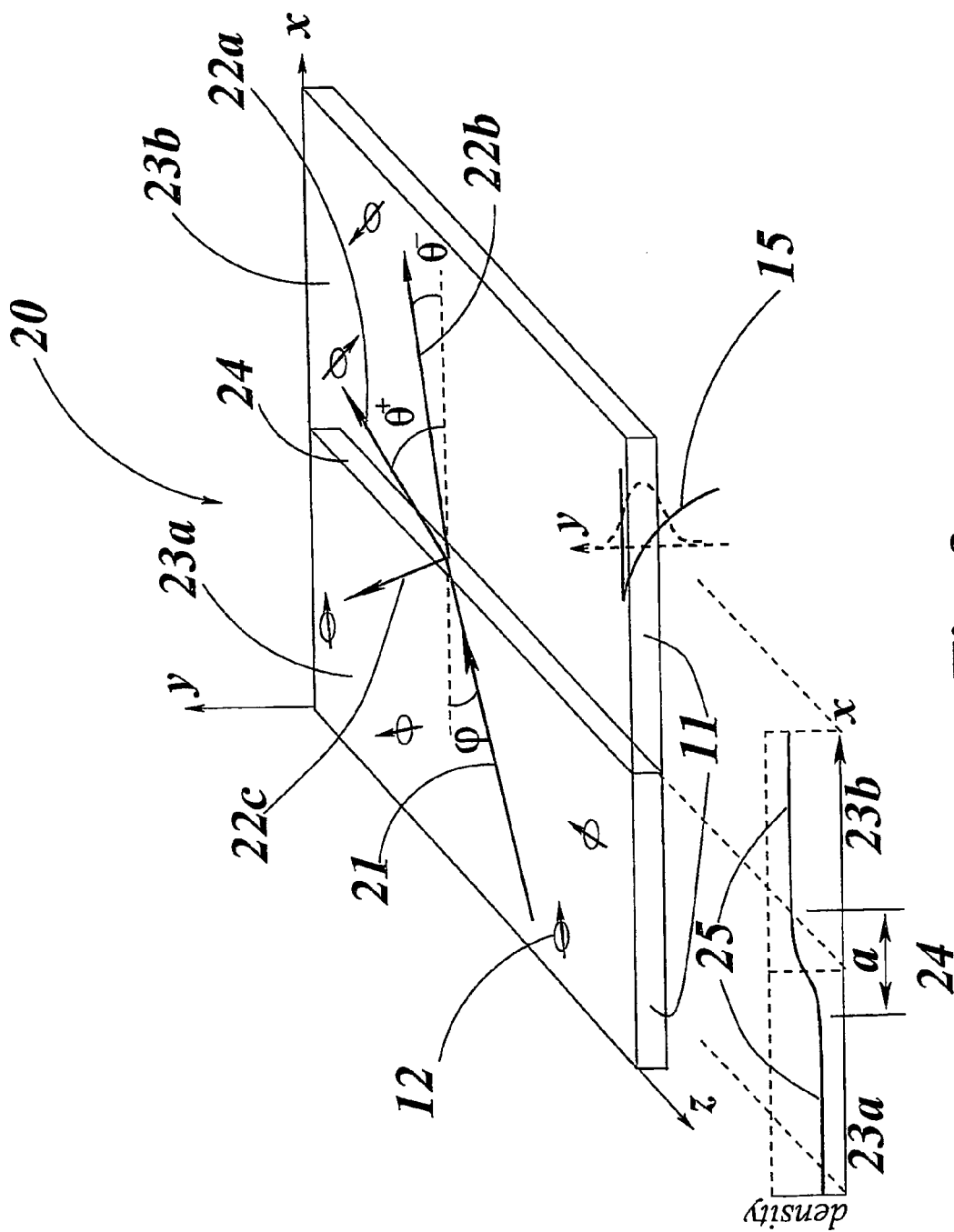
FIG. 2 is an enlarged schematic view of a gas configuration of the present invention suitable to be used in a spin carriers motion manipulating device (spintronic device) of the present invention.

FIG. 2 schematically illustrates a two-dimensional gas configuration of the present invention configured for use in a spintronic device for manipulation of the direction of motion of the spin carrying current carriers (termed "spin carriers"), providing a spin dependent refraction and/or spin dependent reflection of a current of spin carriers. Similarly, for the purposes of clarity, the figure is not to scale and is not in proportion. FIG. 2 illustrates the configuration of the two-dimensional gas 11 of spin carriers 12, e.g., electrons or holes. The gas 11 is confined by a non-uniform potential well 15 (the profile of the wave function of a spin carrier confined by the well is schematically shown by a dashed line) which limits the motion of the spin carriers in the direction perpendicular to the plane of the two-dimensional gas. The potential well 15 in the case of the Rashba spin-orbit interaction has an asymmetrical shape in this direction due to the structure inversion symmetry. The lateral interface 24 is configured in the two-dimensional gas 11 between two regions 23a and 23b characterized by substantially different magnitudes of a spin-orbit coupling constant and/or density of the spin carriers, owing to the nonuniformity of the potential well 15. The gas regions 23a and 23b are in contact with each other along the lateral interface 24. An examples of the profile 25 of a varying magnitude of spin-orbit density across the lateral interface 24 is shown schematically in FIG. 2; a is the width of the transition region, i.e., the width of the region of inhomogeneity 24.

The device configuration provides a desired orientation between a beam 21 of the spin carriers 12 and the region of inhomogeneity 24. This desired orientation is such that the beam 21 of spin carriers contains carriers that impinge onto the region of inhomogeneity 24 at a certain range of non-zero angles of incidence. A spintronic device utilizing such configuration of the two-dimensional gas also includes an arrangement of barriers defining an arrangement of terminals for allowing passage of current through the gas 11, as will be described further below.

The strength of the spin-orbit coupling constant as well as density of the current carriers is determined by the potential well confining the two-dimensional gas 11. The portions of the potential well 15 corresponding to regions 23a and 23b can have a different level of asymmetry, or at least it affects the gas 11 of spin carriers in these regions differently. For example, in one of the portions the potential well 15 can be a symmetrical potential well, while in another portion it can be an asymmetrical potential well. Another option is that the depth of the asymmetrical potential well is different in the two portions, and consequently the gas 11 can have different density of spin carriers in these regions.

In the case of the Dresselhaus spin-orbit interaction, the non-uniform potential well (with the variation of the density of the two-(dimensional gas in the direction parallel to it) is created in the semiconductor structure fabricated from a uniaxial crystal compound with no inversion symmetry. The non-uniform potential well has a different depth in the portions corresponding to the regions 23a and 23b. Accordingly, the gas 11 has different density of spin carriers in these regions.

It should be understood that a combination of the above discussed cases, i.e., asymmetry of the confining potential and lack of inversion symmetry of the crystalline structure, can be also utilized.

The lateral interface 24 leads to spin dependent refraction and spin dependent reflection of spin carriers, i.e., the interface 24 leads to spin dependent deviation of a direction of motion of the spin carriers incident on the interface 24. For instance, in the case of the refraction, the beam 21 of spin carriers incident with a non-zero angle $\phi$ at the interface 24 is split into two transmitted beams, 22a and 22b, propagating at different angles $\theta^-$ and $\theta^+$, as will be described below. Depending on the angle of incidence onto the interface, a reflected beam 22c may also be obtained.

The transmitted beams 22a and 22b have different spin polarizations of the spin carriers. Consequently, according to this embodiment of the invention, there is a possibility to spatially separate the beams with the different spin polarizations. According to the invention, spin carriers incident on the interface (region of inhomogeneity) at a predetermined range of incident angles can be deviated on desired deviation angles, as a result of spin dependent refraction and spin dependent reflection.

Generally, several techniques can be used for the fabrication of a semiconductor structure with parameters varying in the direction parallel to the plane of the two-dimensional gas for purposes of creating the inhomogeneous two-dimensional gas 11 of spin carriers with at least one region of inhomogeneity with laterally varying parameters. Examples of the techniques include, but are not limited to, lithography, etching, deposition and implantation techniques, or any combination thereof (see, for example, S. M. Sze, "*Semiconductor devices: physics and technology*", Wiley Text Books; 2 edition, 2001).

Moreover, the variations of the strength of the spin-orbit coupling constant and/or density in the two-dimensional gas 11 of spin carriers in the plane of the gas can be achieved by applying a bias voltage to one or more gate electrode (not shown) arranged near at least one part of the two-dimensional gas. The gate(s) acting differently on different regions of the two-dimensional gas create a region(s) of inhomogeneity in the two-dimensional gas by changing the strength of spin-orbit coupling constant and/or the density of the two-dimensional gas in the regions of the gas near the gate.

Likewise, the inhomogeneous two-dimensional gas 11 of spin carriers can be created by the application of a combination of the above techniques.

It should be noted that the region of inhomogeneity and each region of the inhomogeneous two-dimensional gas can be of a desired size and form a desired pattern. Moreover, the region can have a required spatial orientation and profiles of the density and spin-orbit coupling constant.

It should also be noted that the two-dimensional gas of the spin carriers can be confined by more than one potential well located in parallel to each other. By applying a bias voltage, the densities of the spin carriers can be redistributed among the different potential wells in the portions of the wells affected by the gate, thus creating a two-dimensional gas with varying parameters. (The term "gas" refers to the entire gas of the spin carriers confined in the different wells and thus may refer to the non-uniform.) It should be understood that creation of the inhomogeneous two-dimensional gas 11 of spin carriers with varying parameters is not limited to the aforementioned techniques and may employ other suitable methods.

Figure 3:
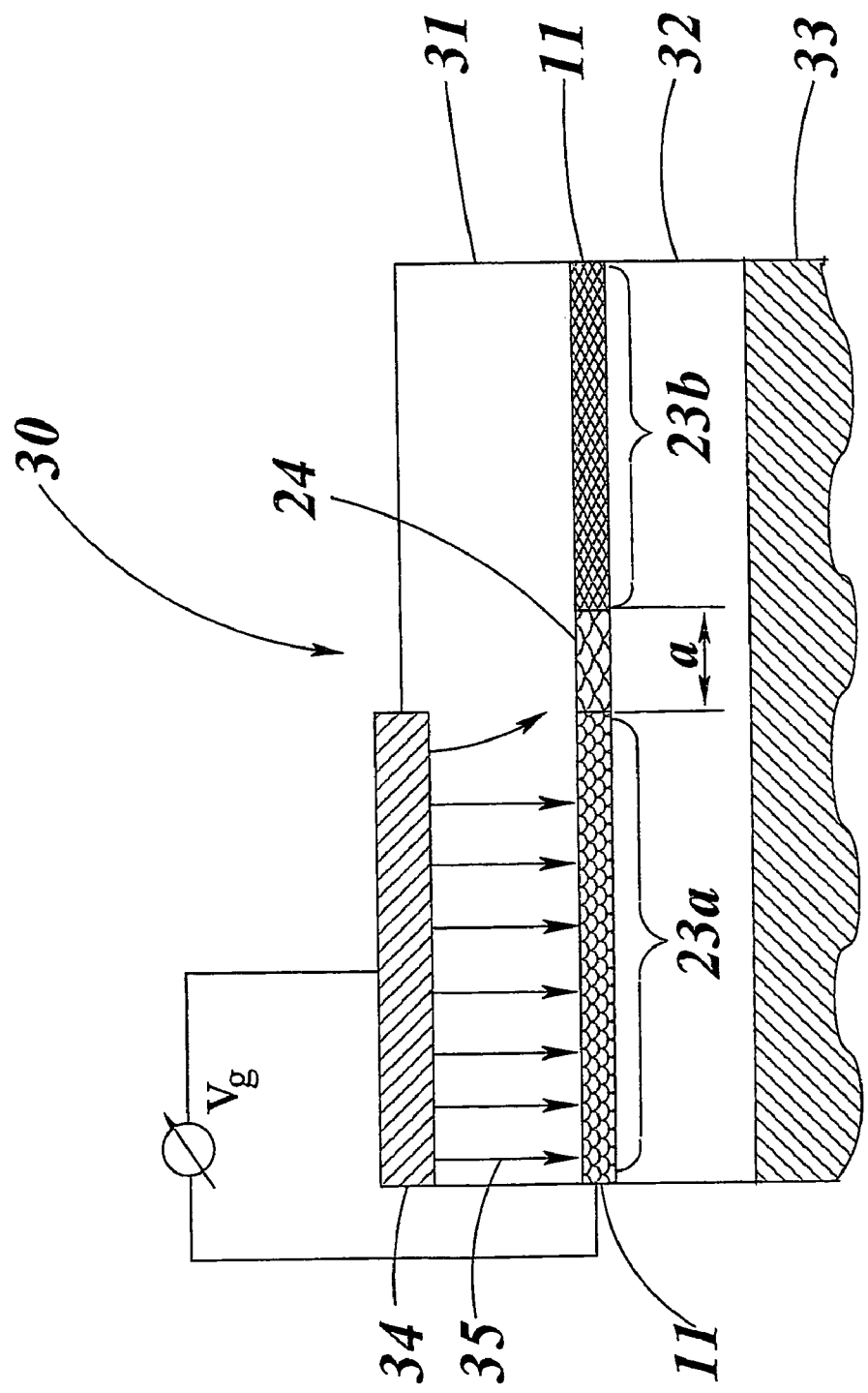
FIG. 3 illustrates an example of implementation of the structure suitable to be used in the spintronic device of the invention providing the gas configuration of FIG. 2.

Referring to FIG. 3, a non-limiting example of the implementation of a semiconductor structure suitable to be used in a spintronic device of the present invention is illustrated. According to this example, a semiconductor structure 30 is a multilayer heterostructure that configures a conducting channel of the two-dimensional gas 11 of spin carrying current carriers is created by two or more layers which for purposes of clarity are shown schematically as only two layers 31 and 32. It should be noted that for the Dresselhaus mechanism to be involved, at least one of the layers (or at least one part of the layer) is fabricated from a uniaxial crystal compound with no inversion symmetry. Actual configurations of the semiconductor structure 30 may also include buffers, spacers, carrier supplying layers, a substrate 33 on which the semiconductor structure is superposed, etc. Examples of the semiconductor structure 30 include, but are not limited to, modulation doped multilayer heterostructures.

The materials used for fabrication of the multilayer semiconductor heterostructures include, but are not limited to, group III-group V and group II-group VI compounds. Examples of the multilayer semiconductor heterostructures fabricated from group III-group V compounds include, but are not limited to $In_xGa_{1-x}As/In_yAl_{1-y}As$, $In_xGa_{1-x}As/InP$, InAs/AlSb, $In_xAl_{1-x}As/In_yGa_{1-y}As/In_zAl_{1-z}As$, etc., wherein x, y and z are in the range of 0.1 to 1. The layers presented schematically as 31 and 32 may, for example, be superposed on a substrate 33, such as InP, GaP, GaN, GaAs, Si, Ge, or any other insulating, semi-insulating, or conducting material.

Examples of the multilayer semiconductor heterostructures fabricated from group II-group VI compounds include, but are not limited to CdTe/HgTe/CdTe, $Hg_xCd_{1-x}Te$ etc., wherein x is in the range of 0.1 to 1.

For purposes of clarity, many other details are not shown, including Ohmic contacts for applying a current passage through the semiconductor structure 30. Likewise, each of the layers 31 and 32 may include a number of layers (not shown).

The semiconductor structure 30 further comprises a gate 34, which is typically a conducting layer arranged on the top of an insulating layer (e.g., $SiO_2$) or a semi-insulating layer (not shown), near the region 23a of the semiconductor structure 30, and serves for applying an electric field 35 (by means of a bias voltage) to this region. It should be understood that the gate 34 can have any desired pattern including, but not limited to, a front, back or split configurations. It can be either a continuous gate or an array of spaced-apart gate elements. The bias voltage applied to the gate 34 provides the electric field 35. The electric field 35 affects the region 23a, and has a value sufficient for altering the properties of the two-dimensional gas of spin carriers confined by the potential well 15 in the region 23a. The consequence of the action of the electric field on the gas in the region 23a is in changing the spin-orbit coupling constant and/or the density of the two-dimensional gas in this region. It should be noted that when required, more than one gate can be arranged in either front (as shown in FIG. 3) or back (not shown) side of the heterostructure. It should be noted that other configuration are also possible, when desired.

In should be understood, that the substantial change of the spin-orbit coupling constant may or may not be accompanied by the change in the density of the electron/hole gas. The strength of the spin-orbit coupling constant in a semiconductor heterostructure with an asymmetric potential well is mostly determined by the sensitivity of the wave function of the spin carriers (electrons or holes) confined by the potential well 15 to the interface (in this paragraph the term "interface" should not be confused with a lateral interface defined above) between the two semiconductor layers with a different width of their band gaps (see layers 31 and 32 in FIG. 3 below). The change of the strength of the spin-orbit as a result of the applied bias voltage (see 35 in FIG. 3) can be caused by shifting the wave function of a confined current carrying particle in the direction perpendicular to the plane of the two-dimensional gas 11 closer to or farther from the interface. In this case, the bias voltage can modify the strength of the spin-orbit, while substantially not affecting the density of the two-dimensional gas.

It should be appreciated by a person versed in the art that the semiconductor structures illustrated in FIGS. 2 and 3 can be used in a spin polarizer device for producing a spin-polarized current of spin carriers or for redirecting the current of polarized spin carriers, and can be a constructing element for spintronic semiconductor devices in various embodiments.

In the further description, the theoretical basis of the technique utilizing the scattering of spin carriers at the region of inhomogeneity will be considered. As a particular example of the region of inhomogeneity, the interface 24 will be studied. It should be noted that hereinafter where it is not specifically emphasized, the two-dimensional gas of electrons will be considered as an example of the spin carriers. However, it should be understood that the invention is not construed as being limited by these examples. The technique of the invention can be applied, mutatis mutandis, to other embodiments utilizing, inter alia, scattering of holes and/or other spin carriers.

Hereinafter, an analysis of the role of spin splitting owing to the spin-orbit interaction in the scattering of electrons at an interface between two regions with different strength of the spin-orbit interaction will be provided. The theoretical analysis justifying the invention will be expounded hereinbelow only for the Rashba mechanism of the spin-orbit interaction in the two-dimensional gas of spin carriers. However, it should be understood that such a theoretical analysis is given for illustrative purposes only, and is not meant to be limiting. Other mechanisms (e.g., the Dresselhaus mechanism), can also be adequately considered for the analysis of the effects of the spin splitting in the scattering of spin carriers (electrons and/or holes) at the lateral interface. The conclusions based on the analysis of the Rashba mechanism presented here have a general character. After this analysis, various embodiments of the spintronic devices utilizing the configuration of the two-dimensional gas exemplified above with reference to FIG. 2 will be described.

As shown in FIG. 2, the two-dimensional gas 11 of spin carriers is confined in the xz plane by the nonuniform potential well 15. Typically, the potential well 15 has a shape of an asymmetric triangle, and, consequently, there is a direction of asymmetry, $\hat{I}$, perpendicular to the electron gas plane. This leads to the appearance of the Rashba term of the spin-orbit interaction, $\alpha(p \times \hat{I})\sigma$, in the Hamiltonian, where $\alpha$ is the spin-orbit coupling constant, p is the momentum and $\sigma$ is the spin of the electron.

The analysis hereinbelow will be carried out for the case when the spin-orbit coupling constant $\alpha$ varies along the x-direction, the interface 24 for convenience of the description is chosen to be located at x=0, and the direction of $\hat{I}$ chosen as $\hat{I}=-\hat{y}$.

Generally, the Hamiltonian has the form:

$$H_R = p_x \frac{1}{2m(x)} p_x + \frac{1}{2m(x)} p_z^2 + B(x) + \frac{1}{2}(\hat{I} \times \sigma)[\alpha(x)p + p\alpha(x)], \quad (1)$$

where m is the effective electron mass, B(x) describes the varying bottom of the conduction band, and the last term describes the Rashba spin-orbit interaction. The bottom of the conduction band B may be different in the region 23a and the region 23b of the two-dimensional gas 11. It should be noted that the difference in B in the regions 23a and 23b may be realized by the fabrication of a semiconductor structure varying in the directions parallel to the plane of a two-dimensional gas. As was noted above, such semiconductor structure with varying parameters can be obtained by (but not limited to) one of the following: lithography, etching/deposition, and implantation techniques, and/or applying a bias voltage to a gate arranged near certain regions of the two-dimensional gas. When required, a combination of the mentioned techniques can be utilized. It should be understood that as the chemical potential is constant along the conducting two-dimensional electron gas 11, the varying bottom of the conduction band implies the varying density of the electron gas.

The current operator corresponding to this Hamiltonian contains a spin-dependent term $$J = \frac{p}{m} + \alpha(x)(\hat{I} \times \sigma). \quad (2)$$

The presence of spin in the current operator implies that in the process of scattering at the interface with varying $\alpha$ the continuity conditions for the wave function will involve the spin degrees of freedom of the electrons. It should be noted that this situation is analogous to the refraction of light where the polarization of light enters the conditions determining the amplitudes of the refraction (i.e., Fresnel formulas).

In order to diagonalize the Hamiltonian with the Rashba term, one has to choose the axis of the spin quantization along the direction ($\hat{I} \times p$). Then the electron states are described by their chiralities (referred to below as "+" and "−"). For an electron in a state with a definite chirality, the spin polarization is perpendicular to the direction of motion. The dispersion relations of electrons with "+" and "−" chirality are given by $$E^\pm = \frac{p^2}{2m} \pm \alpha p + B, \quad (3)$$

$$v = \frac{\partial E^\pm}{\partial p} = \frac{p}{m} \pm \alpha.$$

It should be noted that for both chirality states, the velocity depends on the energy in the same way, to wit, $v = \sqrt{2(E-B)/m + \alpha^2}$, and therefore, the two spin components can be separated only if they are forced to move in different directions.

The kinematical aspects of the electron scattering at the interface between the two regions with different $\alpha$ will be analyzed now. All the waves participating in scattering have the same energy E which determines their momenta as follows:

$$p^\pm = m\left(\sqrt{2(E-B)/m + \alpha^2} \mp \alpha\right) \quad (4)$$

$$= mv_F\left(\sqrt{1 + \tilde{\alpha}^2} \mp \tilde{\alpha}\right)$$

where a dimensionless parameter $\tilde{\alpha} = \alpha/v_F$ is introduced; $v_F$ is the Fermi velocity that depends on electron density and effective electron mass. This dimensionless parameter $\tilde{\alpha}$ will be used hereinafter throughout this description. The conservation of the projection of the momentum on the interface together with Eq. (4) determines the angles of the transmitted and reflected beams (Snell's law).

Figure 4:
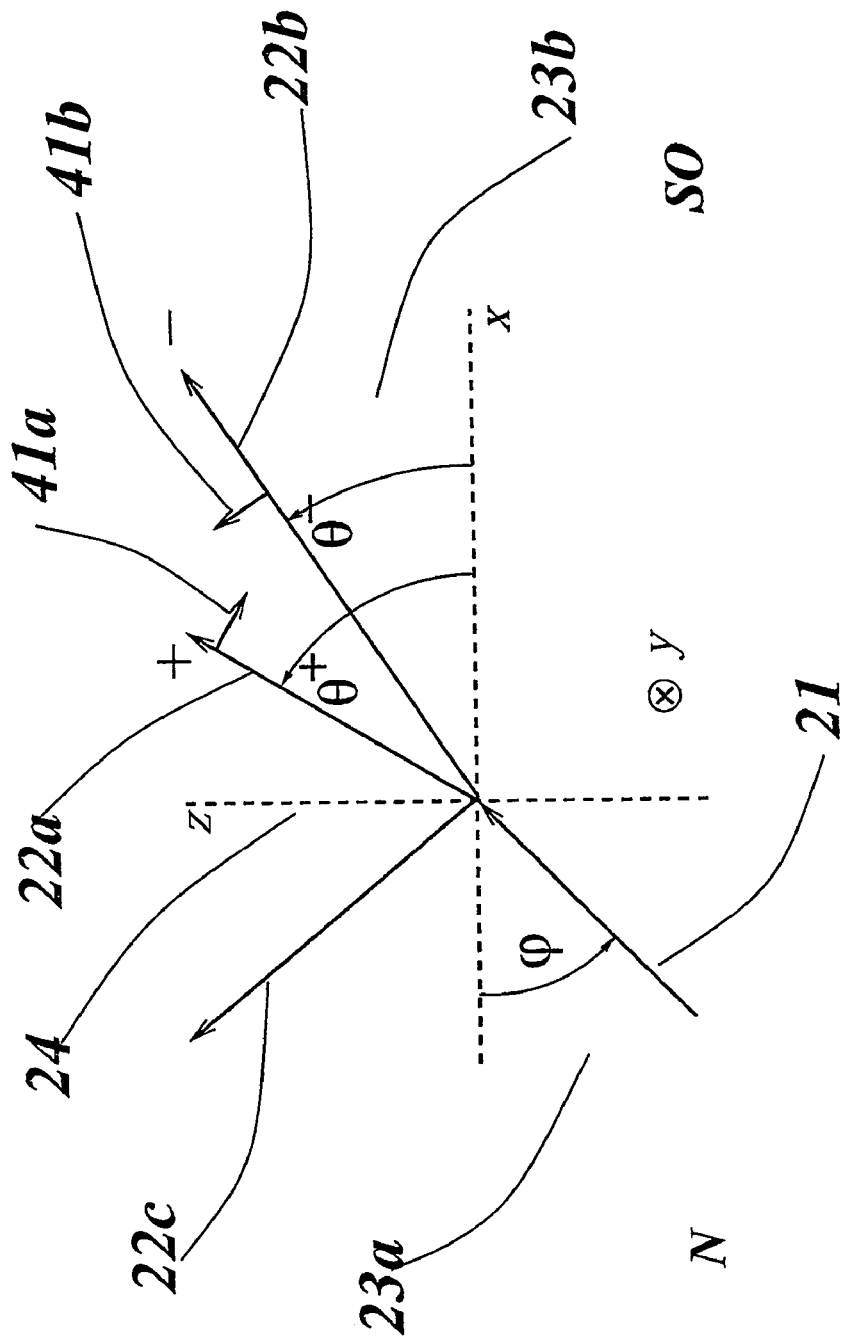
FIG. 4 illustrates an example of the scattering of electrons at the region of inhomogeneity (lateral interface) between two regions of the two-dimensional gas with and without spin-orbit interaction, respectively.

FIG. 4 illustrates an example of the scattering of electrons for the simple case when $\alpha(x<0)=0$. For the sake of clarity, in the description of FIGS. 4-6, the value of the spin-orbit coupling constant in the normal (N) region is taken to be zero. In addition, in the theoretical presentation it will be assumed that the density of the two-dimensional gas of spin carriers is constant across the interface. However, it should be understood that generally normal (N) region is a region with a reduced value of the spin-orbit coupling constant as compared to the adjacent thereto. The region with the reduced value of spin-orbit coupling constant (in the examples of FIGS. 4-6 it is assumed that the spin-orbit interaction term is absent, $\alpha=0$, in this region) is denoted as N ("normal" region 23a), while the region with a relatively high spin-orbit coupling constant (a finite $\alpha$ region) is denoted as SO ("spin-orbit" region 23b).

An unpolarized incident beam 21 of electron is incident on the lateral interface 24 from the N-region at a non-zero angle of incidence $\phi$. After passing across the interface 24, the beam 21 is split in the region SO into two transmitted beams 22a and 22b of different chiralities that propagate at different angles $\theta^-$ and $\theta^+$, respectively. (In the case of $\alpha=0$ there is only one reflected beam 22c that is reflected at the angle equal to the angle of incidence. In general case of $\alpha \neq 0$ the reflected beam acquires two satellites.) The directions of spin polarizations ("+" and "−") are indicated by arrows 41a and 41b, respectively. It should be appreciated that the interface 24 can act as a spin polarizer namely can split an unpolarized beam into two beams of different spin polarizations or redirect the incident beam of a specific spin polarization.

Figure 5:
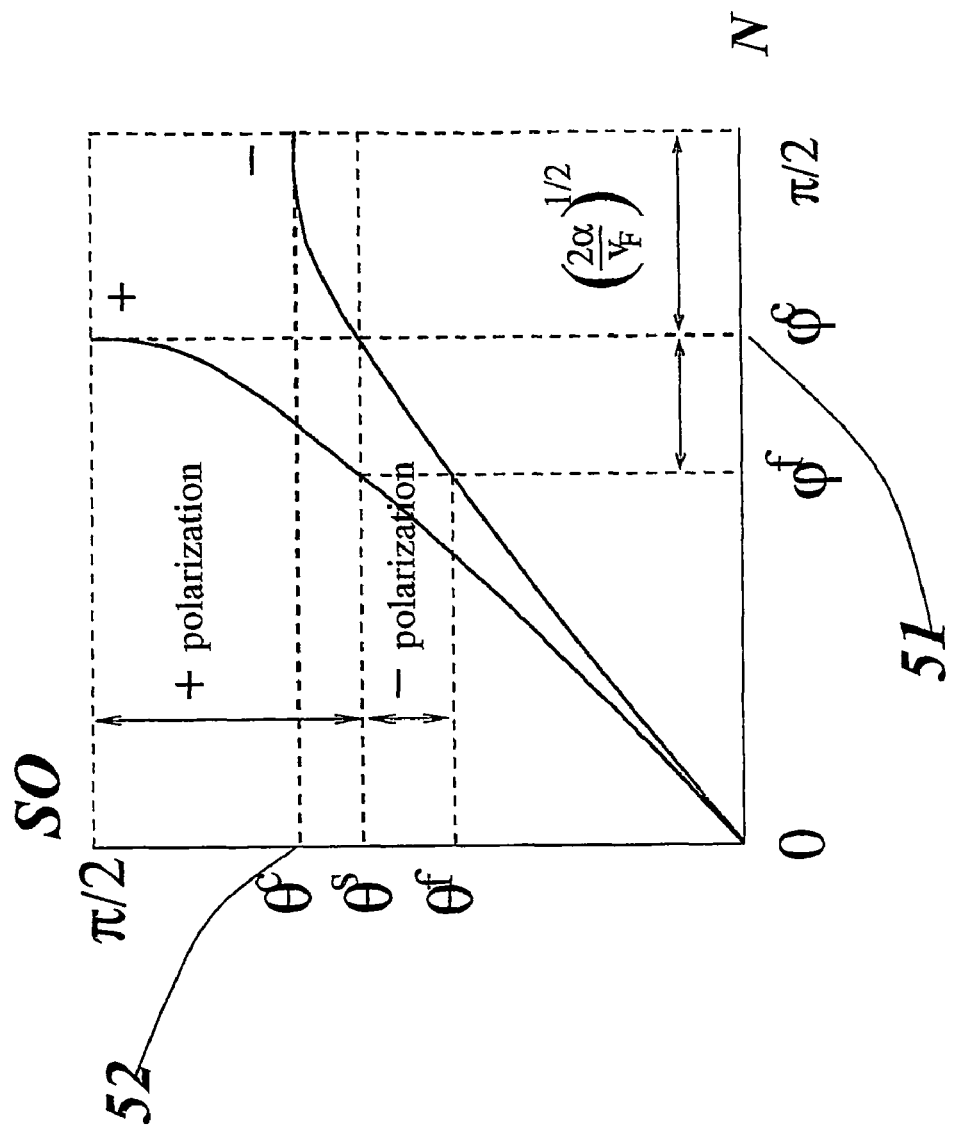
FIG. 5 illustrates an example of dependence of an angle of refraction of electrons for the two spin polarizations as a function of an angle of incidence on the interface between the two regions of the two-dimensional gas with and without spin-orbit interaction, respectively.

Referring to FIG. 5, the result of the calculation of the deviation angles of the two beams 22a and 22b transmitted into the SO-region vs. the angle of incidence are plotted for the case, taken only as an illustrative example, when the spin-orbit interaction in the N-region vanishes completely and the density of the electrons in N- and SO-regions is the same, i.e. B(x)=const. As can be understood, the SO-region is optically more dense for the "+" chirality state (i.e., it has a smaller wave vector) and less dense for the "−" chirality state. Consequently, the "+" chirality state is refracted to larger angles than the chirality state. Moreover, the "+" chirality state exhibits a total reflection for an angle of incidence in the interval so $\phi^c < \phi < \pi/2$, where $\phi^c$ is the critical angle 51 for total internal reflection. This fact will be utilized herein later in the description related to spin filtration and spintronic devices of the present invention.

It should also be noted that in the SO-region the "−" chirality state has a limited aperture corresponding to $\theta^c$, the maximal angle 52 of the refraction for the "−" chirality state. Hence, there exists an interval of outgoing angles, $\pi/2 > \theta > \theta^c$, where only the "+" component can penetrate in the SO-region. As should be appreciated by a person versed in the art, an ideal spin filter can be fabricated by collecting electrons from this interval.

Spin filtration can utilize an interval of incident angles $\phi^f < \phi < \phi^c$. For an angle of incidence, within this interval, the transmitted beams of different chirality do not overlap. Namely, the "+" chirality state scatters into the angular interval $\pi/2 > \theta > \theta^s$, while the "−" chirality state fills the angular interval $\theta^s > \theta > \theta^f$, where $\theta^s$ is the angle of separation of the two polarizations (see FIG. 5 for a graphical definition of the angles $\phi^f$, $\theta^f$ and $\theta^s$).

It should be noted that all angle intervals indicated in FIG. 5 are not narrow as their widths have a square root dependence on $\tilde{\alpha}$. In particular, it follows from Snell's law that $(\pi/2 - \phi^c) \approx (\pi/2 - \theta^c) \approx \sqrt{2\tilde{\alpha}}$.

Actually, it is possible to reduce angle $\theta^c$ even further by a combined action of the difference in the spin-orbit coupling constant and density across the interface. This can be achieved by fabrication of a semiconductor structure with parameters varying in the direction parallel to the plane of the two-dimensional-gas. For example, by etching and/or deposition techniques, or with the gate(s) acting differently on the different regions of the electron gas, one can shift the bottom of the energy band relative to the Fermi-energy differently in the N- and SO-regions, i.e., $\delta B = B(-\infty) - B(+\infty) \neq 0$. With the use of Eq. (4), it can be shown that when $\delta B$ increases (it corresponds to lowering of the density in the N-region) the angle interval $(\pi/2 - \theta^c)$ grows and reaches $2\sqrt{\tilde{\alpha}}$. However, at that moment, which is optimal for spin filtration, the angle for total internal reflection reaches its limiting value $\pi/2$. Starting from this point, the angle interval suitable for the spin filtration narrows and eventually becomes $\sim \tilde{\alpha}$ instead of $\sim \sqrt{\tilde{\alpha}}$.

Hereinafter, a quantum mechanical analysis of the refraction of electrons at the interface between two regions with different magnitude of the Rashba term will be provided. The relations between the incident, reflected and the transmitted waves can be found from the solution of the Schroedinger equation. For purposes of clarity, it is assumed that B(x)= const, and only the case of the N- and SO-interface is discussed. The problem can be considered for the two limiting cases of "sharp" and "smooth" interfaces, i.e., when the width of transition zone between the N-region and SO-region is smaller or larger than the electron de Broglie wavelength $\lambda_F$ of the incident electrons, respectively. In other words, in the case of the sharp interface, the parameter $\alpha$ changes abruptly between the N-region and SO-region, while in the case of the smooth interface, $\alpha$ changes continuously on the scale of the order or larger than the electron wavelength $\lambda_F$.

For the case of the sharp interface between the N- and SO-regions, the scattering states of an electron coming from the N-region in the incident state $e^{i(p_x x + p_z z)} \chi_N^+$ can be described by $$\Psi^+ = e^{i p_z z} \begin{cases} e^{i p_x x} \chi_N^+ + e^{-i p_x x} \chi_N^+ r_{++} + e^{-i \bar{p}_x x} \chi_N^- r_{-+}, & x < 0 \\ e^{i p_x^+ x} \chi_{SO}^+ t_{++} + e^{i \bar{p}_x^+ x} \chi_{SO}^- t_{-+}, & x > 0 \end{cases} \quad (5)$$

where $\chi_{N/SO}^\pm$ are spinors corresponding to the "+"/"−" chiral states in the N/SO-regions, and r and t are the amplitudes of the reflected and the transmitted waves. A similar expression holds also for $\Psi^-$ which evolves from the incident state $\chi_N^-$.

For the sharp interface the amplitudes r, t can be found from the continuity conditions that follow from the Schroedinger equation with the boundary conditions:

$$\left[\frac{p_x}{m(x)} - \alpha(x)\sigma_z\right]\Psi\Big|_N^{SO} = 0; \quad \Psi\Big|_N^{SO} = 0 \quad (6)$$

where any function $\Phi|_N^{SO}$ denotes $\Phi(x=+0) - \Phi(x=-0)$. Analysis of Eq. (6) shows that in the course of refraction at the interface with $\tilde{\alpha} \ll 1$, transitions between waves with different chiralities are strongly suppressed—namely, the amplitude $t_{+-} \sim \tilde{\alpha} \langle \chi_{SO}^- | \chi_N^+ \rangle \sim \tilde{\alpha}^2 \tan \phi$, and similarly for $t_{+-}$. An extra factor of $\tilde{\alpha} \tan \phi$ in the off diagonal amplitudes is a consequence of the fact that angles of deviation of the refracted electrons are small, and therefore the overlap of the spinors of different chiralities tends to vanish. The amplitudes $t_{-+}$ and $t_{+-}$ reach their maximal values $\sim \tilde{\alpha}^{3/2}$ at $\phi \approx \phi^c$, where deviation angles are maximal and $\langle \chi_{SO}^- | \chi_N^+ \rangle \sim \sqrt{\tilde{\alpha}}$.

Figure 6:
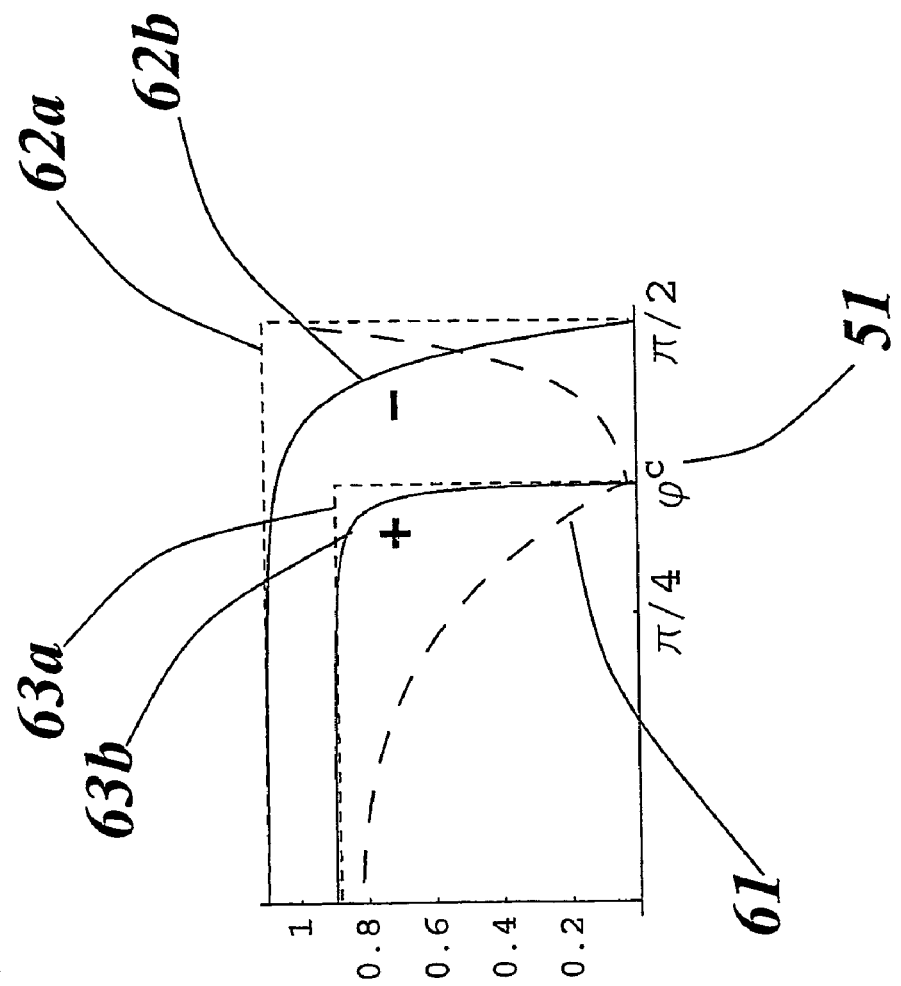
FIG. 6 illustrates the intensity of the fluxes of electrons transmitted through the interface without changing their chirality.

FIG. 6 illustrates the intensity of fluxes of the transmitted electrons without a change of their chirality $(\partial \theta^+/\partial \phi)^{-1} |t_{++}|^2$ and $(\partial \theta^-/\partial \phi)^{-1} |t_{--}|^2$ per unit angle (radian) of the refracted electrons, as a function of an incidence angle. The curves 62a and 62b describe the intensity of flux of transmitted electrons of "−" chirality for a smooth and sharp interface, respectively. The curves 63a and 63b describe the intensity of flux of transmitted electrons of "+" chirality correspondingly for a smooth and sharp interface. The intensities of fluxes are different even at normal incidence because of the difference of the refraction angles of the two modes. The dashed line 61 indicates the level of spin polarization, $|r_-/r_{++}|^2$, of the reflected electrons for an unpolarized incident beam 21. As can be seen, the drop of the intensities occurs practically only due to the reflection which becomes decisive for $\phi \gtrsim \phi^c$. The amplitudes $t_{-+}$ and $t_{+-}$, and, similarly, the amplitudes of the reflection with a change of the chirality, $r_{+-}$ and $r_{-+}$, are negligible at any angle. These amplitudes reach their maximal value $\sim \tilde{\alpha}^{3/2}$ at angle $\phi^c$ (51 in FIGS. 5 and 6). Therefore, when total reflection occurs for the "+" chirality state at $\phi \geq \phi^c$, its intensity is left mostly in the state of the same chirality.

At angles $\phi \geq \phi^c$ the amplitude $r_{++}$ is close to unity, while $r_{-}$ is still small (as well as $r_{-+}$). It appears that for the angle of incidence equal to angle $\phi^c$ the ratio $|r_-/r_{++}|^2$ has a cusped minimum. For small $\tilde{\alpha}$ this ratio has a limiting value $\approx 0.03$ at the minimum. Therefore, when an unpolarized electron beam 21 (see FIG. 4) is incident upon the interface 24, the reflected beam 22c acquires a significant level of spin polarization at $\phi \approx \phi^c$ (see, for example, the dashed line 61 in FIG. 6).

It should be noted that this situation is analogous to the Brewster angle in the reflection of light. An angular interval around $\phi^c$, where the degree of polarization of the reflected beam remains large enough, is not so narrow (see, for example, FIG. 6). According to the invention, this fact provides for using reflection for the purpose of spin polarization.

Now the case of the electron scattering at a smooth interface will be discussed, i.e. when $\alpha$ changes continuously on the scale of the order or larger than the electron wavelength $\lambda_F$. The analysis of the refraction at a smooth interface can be carried out by using, for example, a small parameter $\eta = (d\alpha/dx)/\alpha v_F \sim /\alpha \ll 1$, where $\alpha$ is a characteristic scale of the width of the region with varying $\alpha$ (i.e., an effective width of the interface). Due to the smoothness of the interface, the electron spin adjusts itself adiabatically to the momentum keeping its polarization in the direction perpendicular to the momentum. In addition, since $\eta \ll 1$, the reflected wave can be neglected, if $\phi < \phi^c$. Having these arguments in mind, a solution can be sought, which evolves from the state $\chi^+$ in the form generalizing the Wentzel-Kramers-Brillouin (WKB) approximation to include the spin degrees of freedom:

$$\Psi^+ = \phi_{++}(x)\frac{\chi^+(x)}{\sqrt{v_x^+}}e^{i\int p_x^+ dx} + \phi_{-+}(x)\frac{\chi^-(x)}{\sqrt{v_x^-}}e^{i\int p_x^- dx} \quad (7)$$

with $\phi_{++}(x=-\infty)=1$ and $\phi_{-+}(x=-\infty)=0$.

In order to obtain an admixture of the wave with the opposite chirality, $\phi_{-+}$ and $\phi_{+-} \neq 0$, one has to analyze the Shroedinger equation up to first order in $\eta$. It should be noted that this equation is similar to the equation describing transitions in a two-level system subjected to an oscillating perturbation (see, for example, I. I. Rabi, *Phys. Rev.*, 1937, V. 51, P. 652). The latter arises owing to the phase difference of the two WKB waves in Eq. (7). The analysis shows that the admixture of a wave with different chiralities due to a smooth interface is very small, to wit: $|\phi_{-+}|^2 \sim \sin^2\phi(\eta\alpha_{SO}/v_F)^2 \ll 1$ or $\sin^2\phi (\alpha_{SO}/v_F)^4$, whichever is smaller. Moreover, for the case of the smooth interface the shape of each of the "+" and "−" curves (curves 62a and 63a in FIG. 6) becomes even more rectangular than in the case of a sharp interface, which is favorable for the applications of the invention.

It should be understood that the rectangular shape of the curves 62a and 63a makes the direction of motion of the spin carriers to be very sensitive to the modulation of the spin-orbit density by the bias voltage, or to be very sensitive to a change in the angle of incidence of the spin carrying current carriers on the region of inhomogeneity, thus leading to an effective redirection of the spin carriers. The rectangular shape of the curves 62a and 63a near the angle of total internal reflection results in the threshold response of the electrical resistance of the device and/or switching of the direction of current to a small variation of controlling parameters (e.g. the bias voltage and/or angle of incidence).

Summarizing the above consideration of the electron/hole scattering, it can be appreciated that for both of the discussed cases, each of the spin chiralities propagates along its own trajectory, while the change of the chiralities is insignificant. Hence, the process of spin filtering can be based on the kinematical separation of the trajectories of electrons having different chiralities.

With regard to the temperature effects on the scattering of the spin carriers the following should be noted. It is appreciated by a person versed in the art that the effect of spin dependent deviation of the spin carriers at the interface 24 are mostly controlled by the kinematics. Since the angle for total internal reflection is different for electrons of different energies, the temperature leads to a smearing of $\phi^c$. The polarizing properties will not be influenced noticeably until the smearing $\delta\phi^c \leq (\pi/2-\phi^c)$. This leads to the following condition on the temperature smearing of the angle $\phi^c$: $\delta\phi^c/(\pi/2-\phi^c) \approx T/4E_F \leq 1$, where $E_F$ is the Fermi energy. It is known that a value of the Fermi energy, for example, for heterostructures fabricated from $In_xGa_{1-x}As/In_yAl_{1-y}As$ can correspond to the temperatures of the order of 1000K, and even higher. In other words, the influence of temperature on the scattering of the spin carriers at the interface 24 in such systems is insignificant and can be neglected.

It should be appreciated that that the case of the N/SO interface, analyzed in the present description, was taken mostly for illustration purposes. Actually, any lateral interface between the two regions of the gas having different magnitude of, inter alia, spin-orbit coupling constant and/or density of the spin carriers, as well as other configurations of the regions of inhomogeneity in the gas, can produce separation of the trajectories of the spin carriers with different spin polarizations, provided that the spin-orbit coupling constant has a non-zero value at least in one of the regions. Such a lateral interface (or generally, region of inhomogeneity) can be utilized for the purpose of spin polarization and filtration. In particular, for the case $SO_1/SO_2$ when the interface is created by two regions each having non-zero spin-orbit coupling constant, in the analysis above, one should replace $\tilde{\alpha}$ by the difference of the corresponding spin-orbit coupling constants $\delta\tilde{\alpha} = \tilde{\alpha}_1 - \tilde{\alpha}_2$ across the interface.

It should be noted that in the recent experiments by Sato et al. (Y. Sato, T. Kita, S. Gozu, and S. Yamada, *Journal of Applied Physics*, Vol. 89, P. 8017, 2001) the effect of a large spontaneous spin splitting in gate-controlled two-dimensional electron gas has been observed. A decrease of the spin-orbit coupling has been reported when the density of the electron gas was reduced.

In particular, it was reported that in a gate controlled electron gas formed at $In_{0.75}Ga_{0.25}As/In_{0.75}Al_{0.25}As$ heterojunction, the densities of the spin split sub-bands can differ by as much as 50%. This splitting of the sub-bands corresponds to $\tilde{\alpha}=0.1$. It should be noted that by altering the bias voltage $V_g$ the spin-orbit coupling constant can be reduced by a factor of 2.

These experimental observations support the feasibility of the invention for the purpose of spin filtration. For example, when the variation of the spin-orbit coupling constant across the interface, $\delta\tilde{\alpha} = \tilde{\alpha}_1 - \tilde{\alpha}_2$, is set to 0.05 (measured in units of Fermi velocity), the angular interval of the total reflection can, for example, be higher than about 20°. This value is wide enough for resolving the deviation angles and collecting the polarized spin carriers at the terminals. In principle, the device of the present invention is feasible when the variation of the spin-orbit coupling constants across the interface between two regions of the semiconductor structure is larger than about 0.001.

In view of the results of the analysis of the electron scattering described above, the two-dimensional gas configuration presented in FIG. 2 can be utilized for construction of spintronic devices in various modifications.

It should be noted, that hereinafter the term "N-region" will be referred to the region in which the spin coupling constant, $\tilde{\alpha}=\tilde{\alpha}_N$, is smaller than the spin coupling constant, $\tilde{\alpha}=\tilde{\alpha}_{SO}$, in the other region (denoted as "SO-region"), i.e., $\delta\tilde{\alpha}=\tilde{\alpha}_{SO}-\tilde{\alpha}_N>0$.

It should be further noted that in the presence of other mechanisms of the spin-orbit interaction leading to the spin-splitting of the energy spectrum, $E^\pm$, of the spin carriers the parameter $\tilde{\alpha}$ should be understood as $\tilde{\alpha}=(E^+-E^-)/4E_F$.

Figure 7:
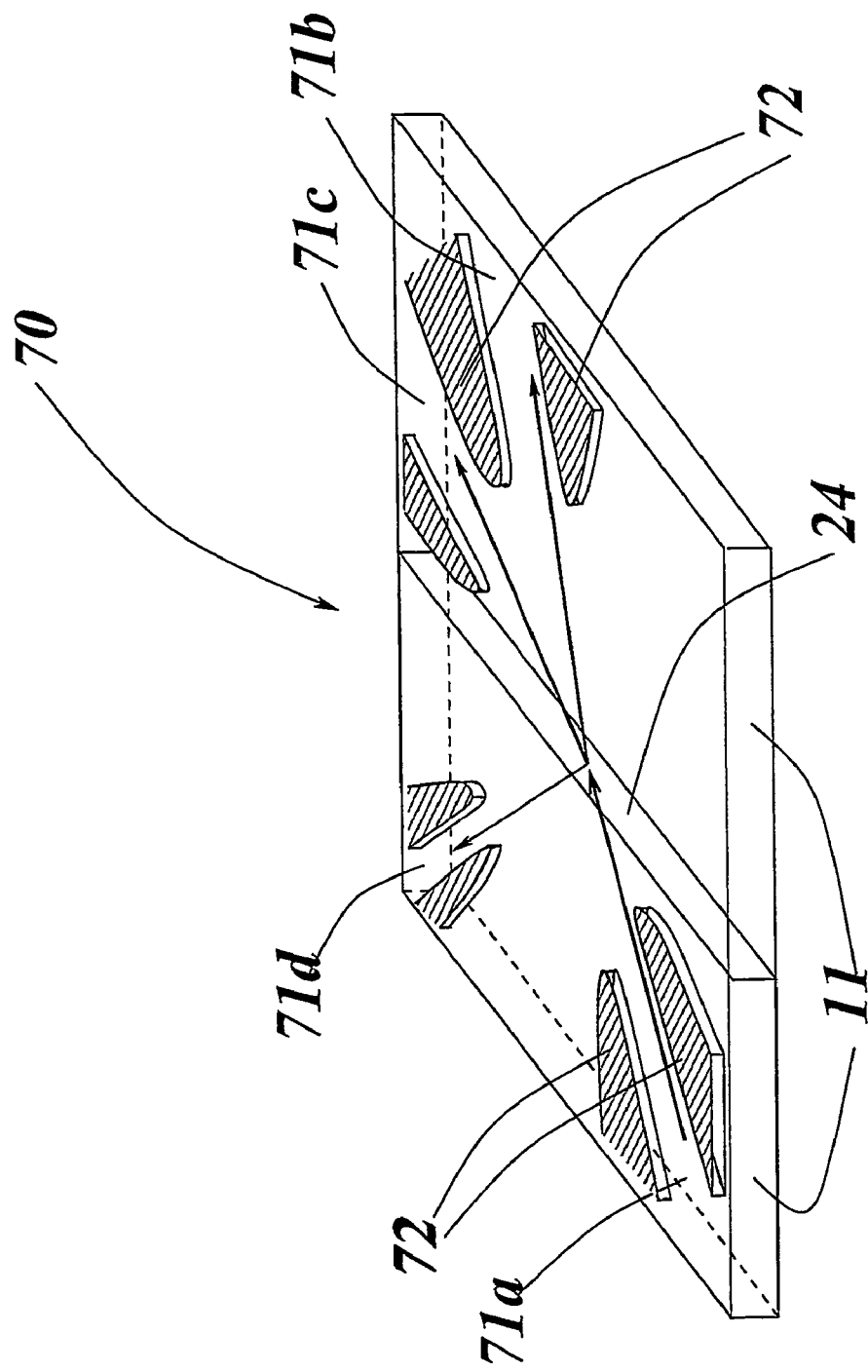
FIG. 7 schematically exemplifies a spin-polarizer splitter, according to one embodiment of the present invention.

Referring to FIG. 7, an example of a spintronic device 70 of the present invention is illustrated. The spintronic device 70 includes a semiconductor structure containing a two-dimensional gas 11 configured as described above with reference to FIG. 2, and includes an arrangement of barriers, generally at 72 (shown as shaded elements in FIG. 7, where only one pair of barriers is numbered for purposes of clarity of the illustration). The barriers 72 are arranged in the semiconductor structure in a predetermined manner to define two or more spaced-apart terminals 71a-71d in a two-dimensional gas 11. Each terminal is defined by a space between two nearest barriers 72 arranged in the two-dimensional gas 11 for allowing a passage of spin carriers therebetween. The barriers 72 can be formed in the gas 11 by gates. Likewise, the barriers can be provided by known per se lithography, etching, deposition implantation and any other suitable technique.

The terminal 71a is an injector terminal, for example, configured for providing a current of unpolarized spin carriers. At least one terminal from the other terminals is a collector configured (located) to receive a spin-polarized current. Two terminals may be provided (as exemplified in FIG. 7) to receive current carriers of different spin polarizations, respectively. Thereby, the spintronic device 70 can be used as a spin polarization splitter of the current carriers. According to the invention, the spin polarized current carriers received by the collector terminal(s) can be used for subsequent spin manipulations.

When the collector terminals are configured spatially to receive carriers of a selected spin polarization, the spintronic device 70 can be used as a spin filter for producing a spin-polarized current of spin carriers. This is exemplified in FIG. 8.

Figure 8:
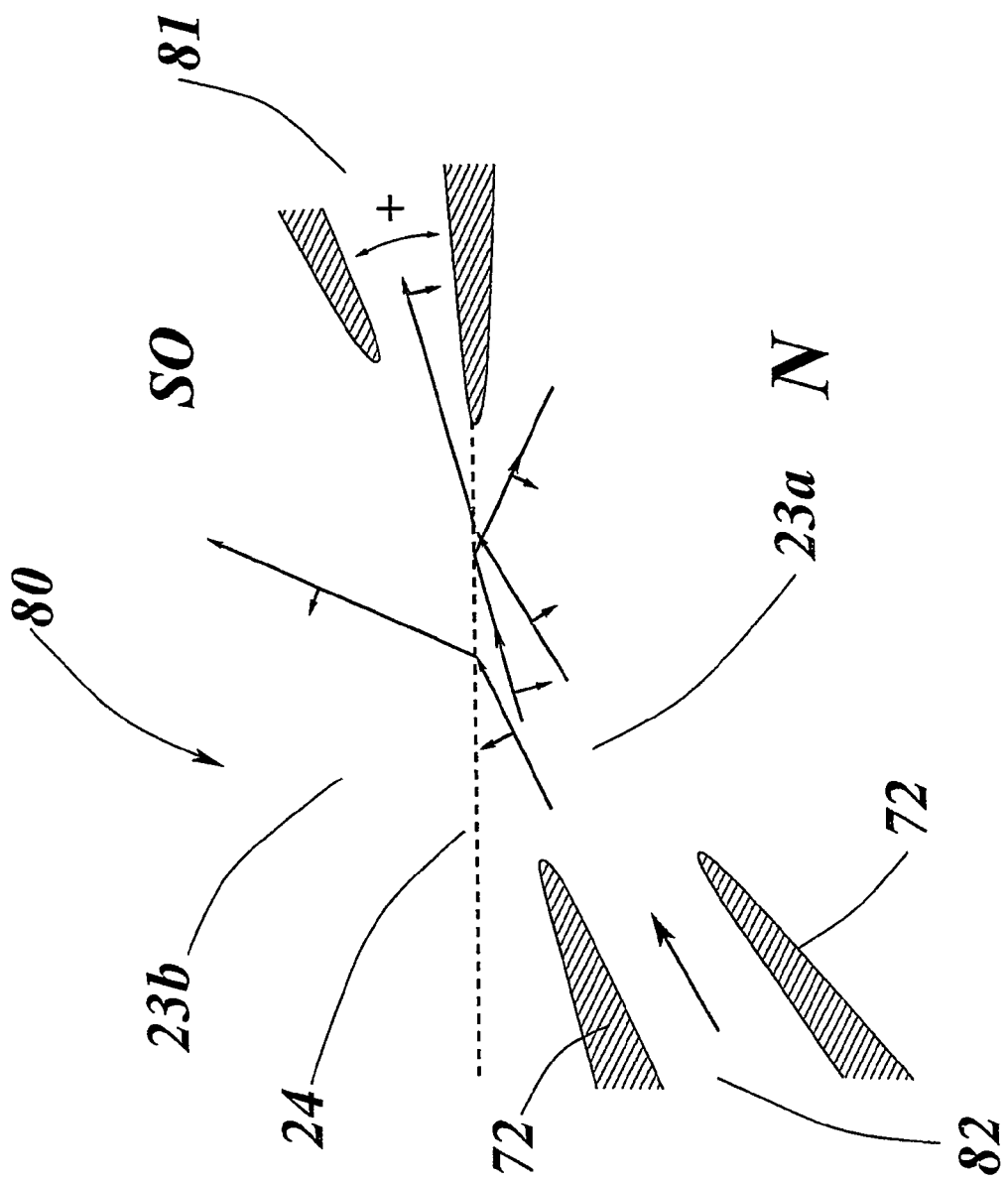
FIG. 8 schematically illustrates an example of implementation of a spin filter of the present invention.

FIG. 8 illustrates an example of the implementation of the above-described spintronic device 70 for producing the spin polarization current. In this example, a device 80 includes a semiconductor structure containing an inhomogeneous two-dimensional gas 11 of current carrying particles (as described above) having a lateral interface 24 between N- and SO-regions 23a and 23b; and a barriers' arrangement 72 configured to form terminals 81 and 82. The terminal 82 is arranged to serve as an injector of unpolarized current carriers, and the terminal 81 is arranged to serve as a collector of spin carriers of specific polarization. The unpolarized current carrying particles, provided by the injector 82, after passing across the interface 24 between the N- and SO-regions of the two-dimensional gas are deviated on angles which depend on spin polarization of spin carriers. The collector 81 is configured spatially in a way such that only carriers with a "+" spin-polarization can reach the collector 81.

It should be appreciated by a person versed in the art that each of the embodiments of the spintronic device illustrated in FIGS. 7 and 8 can be used as a spin filter for producing a current of spin carriers having a predetermined spin polarization.

In the above-described examples of FIGS. 4, 7 and 8, the semiconductor structure is configured to define a region of inhomogeneity of the two-dimensional gas in the form of lateral interface between two regions with different value of spin-orbit density. However, as indicated above, this is a specific example of the region of inhomogeneity. The following are some examples of a spintronic device of the present invention configured to define a stripe-like region of inhomogeneity of a two-dimensional gas of current carriers. It should be understood that the term "stripe" used herein refers to an elongated region of inhomogeneity of the two-dimensional gas with a reducing or increasing magnitude of the spin-orbit coupling constant or in general varying spin-orbit density (either continuously varying or not). This stripe region with the varying spin-orbit density is either a relatively N-region or relatively SO-region as compared to its surroundings.

Figure 9:
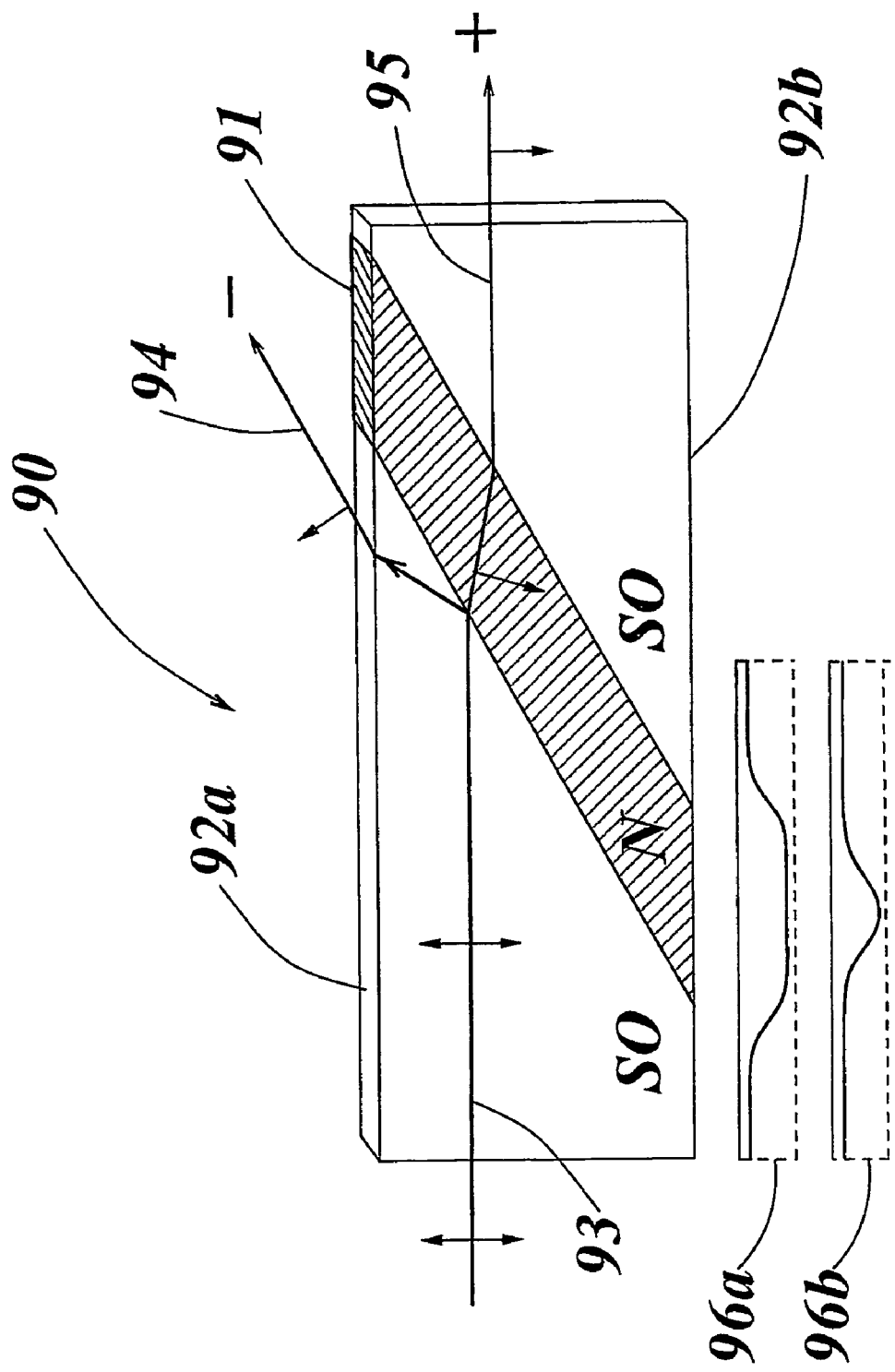
FIG. 9 exemplifies another realization of the spin filter according to the invention configured with a region of inhomogeneity formed by a stripe.

Referring to FIG. 9, a spintronic device 90 of the present invention is illustrated configured for performing spin filtration. The configuration of the device according to this example is analogous to the Glan style optical polarizers made of uniaxial crystals. The device 90 includes a semiconductor structure containing a two-dimensional gas of current carriers configured to define a stripe-shaped region of inhomogeneity 91 of the gas with a reduced strength of the Rashba term which is sandwiched between two spin-orbit sub regions 92a and 92b of the gas, thereby forming SO—N—SO lateral configuration (92a-91-92b) of the two-dimensional gas. This lateral configuration defines N-stripe 91. In FIG. 9 two examples 96a and 96b of a profile of a variation of one of the parameters characterizing the two-dimensional gas in the direction parallel to the plane of the two-dimensional gas across the interface are shown schematically.

As described above, the spin carrier of "−" chirality can be totally reflected at the SO—N interface. The orientation of the stripe 91 with respect to an axis of propagation of an unpolarized electrons' beam 93 (generally, a current of spin carriers) is chosen in such a way that the angle of incidence of the electron beam 93 onto the stripe 91 exceeds the angle for total internal reflection for the "−" chirality state. Consequently, the input beam 93 is split at the interface SO—N defined by SO-region 92a and stripe 91, into two beams 94 and 95, where the "−" chirality state beam 94 is redirected from the SO—N interface, while the "+" chirality state beam 95 passes through the SO—N—SO junction mostly unaffected. The reflected beam 94 ("−" chirality state) can carry almost all of its initial intensity as the change of the chirality is inefficient, i.e., $r_{--}\approx1$ and $t_{+-}$, $r_{+-}\approx0$.

As have been shown above, the kinematics of the refraction allows for two additional beams (not shown) emerging on each side of the stripe. These beams are not shown in FIG. 9 because their intensity is negligible (as described in the above analysis). It should be understood, that the stripe 91 can be created by fabrication of a semiconductor structure with parameters varying in the direction parallel to the plane of the two-dimensional gas, as described above.

Figure 10:
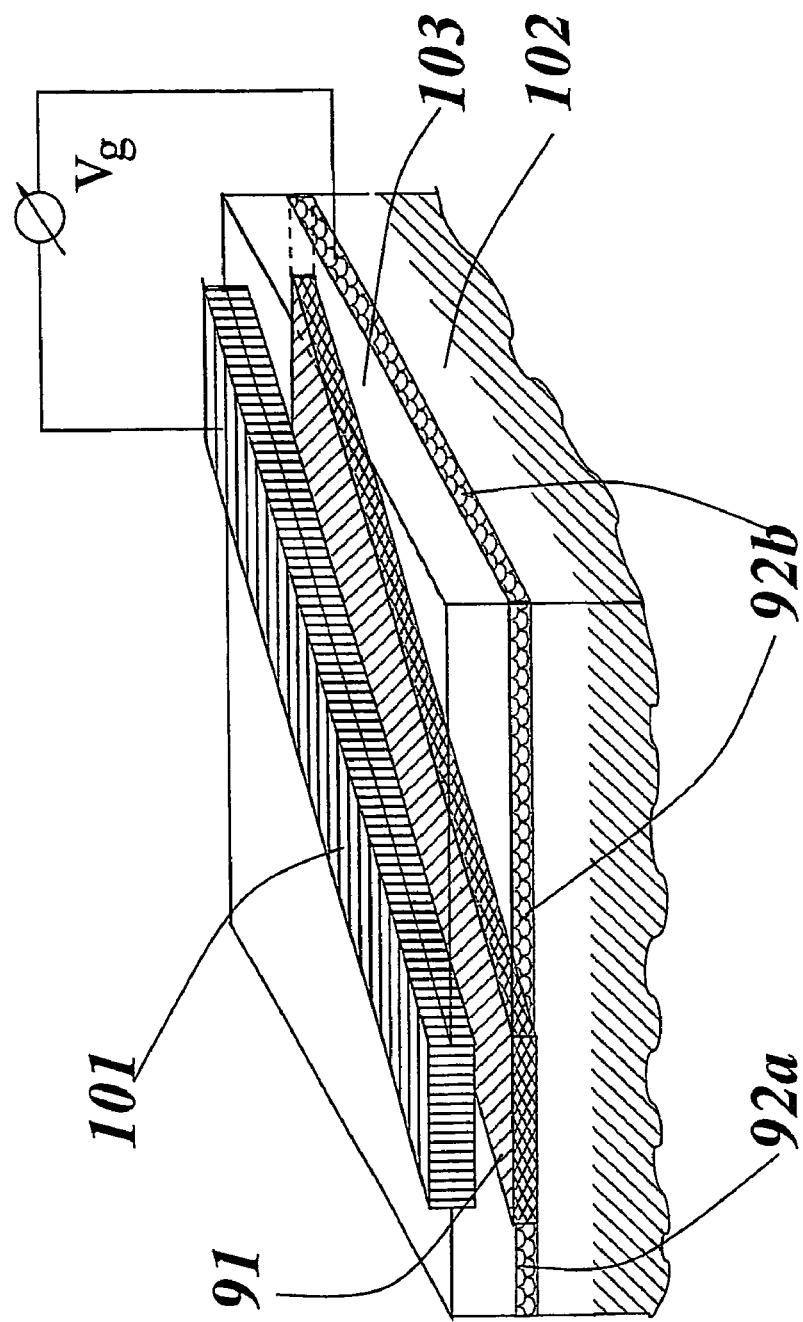
FIG. 10 schematically illustrates a realization of the spin filter by fabricating a gate in the semiconductor structure, according to the invention.

Reference is made to FIG. 10 where the spintronic device discussed in FIG. 9 is illustrated for the case when the stripe 91 is realized by fabricating a gate 101 in the semiconductor structure. It should be noted that the two-dimensional gas 11 of spin carrying current carriers can be created by a number of layers which for purposes of clarity are shown schematically as two layers 102 and 103 only. The N-stripe 91 is created by applying an appropriate bias voltage to the gate 101. As a result, the SO—N—SO lateral configuration (92a-91-92b in FIG. 9) is created in the inhomogeneous two-dimensional gas 11. The injector, collector (both are not shown), and the gate 101 are configured in such a manner that an angle of incidence of the electrons' beam on the stripe 91 exceeds the angle of total internal reflection of the electrons with the "−" chirality.

It should be appreciated by a person versed in the art that each of the devices illustrated in FIGS. 9 and 10 can be used as a spin filter prism, for producing a spin-polarized current from an unpolarized current.

With regard to device 90 of FIG. 9, it should also be understood that the semiconductor structure configuration defining a two-dimensional gas with the region of inhomogeneity in the gas with the enhanced magnitude of the spin-orbit coupling constant, i.e., SO-stripe, inside the N-region would act oppositely, mutatis mutandis.

Figure 11:
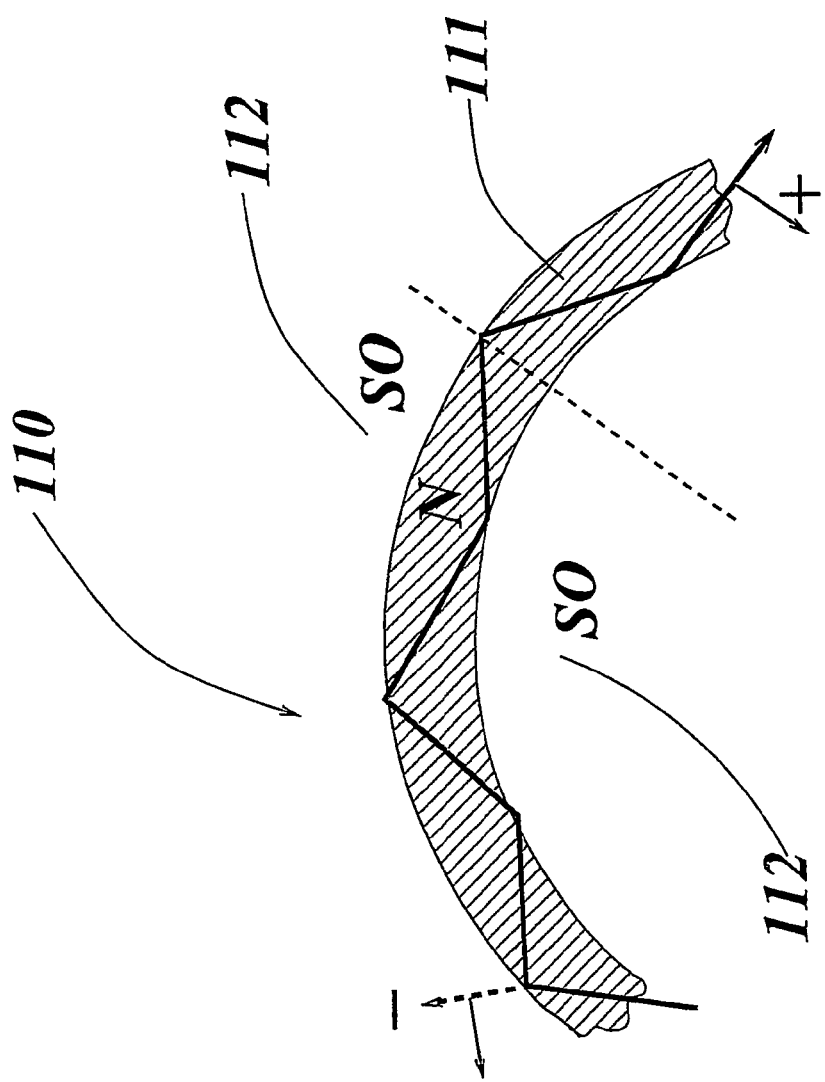
FIG. 11 exemplifies a spin-guide of the current of spin carriers, according to the invention configured with a region of inhomogeneity formed by a curved stripe.

Referring to FIG. 11, still another example of the implementation of a spintronic device 110 of the present invention is illustrated. In this case, the total internal reflection of the spin carriers is used as a basis for the construction of a spin guide. This device, similar to that of FIG. 9, includes N-stripe 111 (elongated N-region), which in the present example is curved, being formed in SO-region, thereby resulting in SO—N—SO lateral configuration 111. The lateral configuration 111 operates as a spin guide, if the semiconductor structure is configured in such a way that electrons are sent inside the stripe 111. The tangent electrons in the state of "+" chirality are trapped owing to total internal reflection, while electrons having "−" chirality leak out. It should be noted that, due to the latter fact, such a guide acts also as a spin polarizer. The feasibility of such a device is based on the fact that the intensity of repolarization $|r_{-+}|^2$, as have been shown above, is very small. When required, the stripe 111 can be curved for conveying the current of spin carriers to a predetermined location of the two-dimensional gas of spin carriers. It should be noted that for guiding carriers of "−" chirality, the device is configured to have the SO-stripe incorporated in N-region, mutates mutandis.

Figure 12:
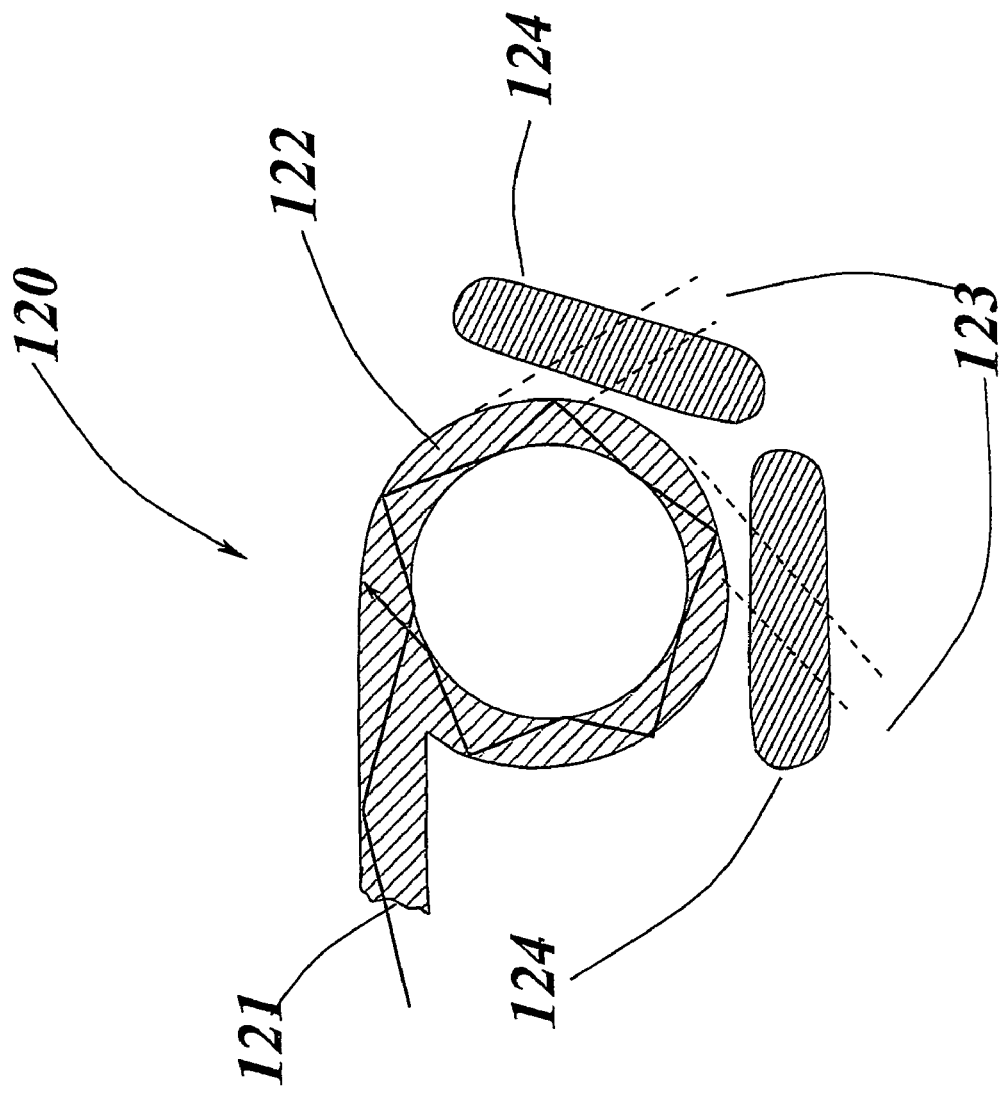
FIG. 12 exemplifies a spin-storage, according to the invention configured with a region of inhomogeneity formed by a closed loop stripe.

FIG. 12 illustrates an embodiment of a spin-guide device 120 that can be used as a spin storage of electrons having desired chirality. In FIG. 12, a semiconductor structure containing a two-dimensional gas of current carriers is configured to define a stripe in the gas (which may be N-stripe in an SO-regions or may be SO-stripe in an N-region) in the form of a closed loop 122 (e.g., a ring) with an entrance 121 and an exit 123. It should be understood that, when required, more than one exit can be utilized.

The exit 123 from the storage can be controlled by a properly arranged gate (or gates) 124. By applying an appropriate voltage to the gate 124, and thereby opening the exit 123, a pulse of the spin polarized electrons can be obtained.

Figure 13:
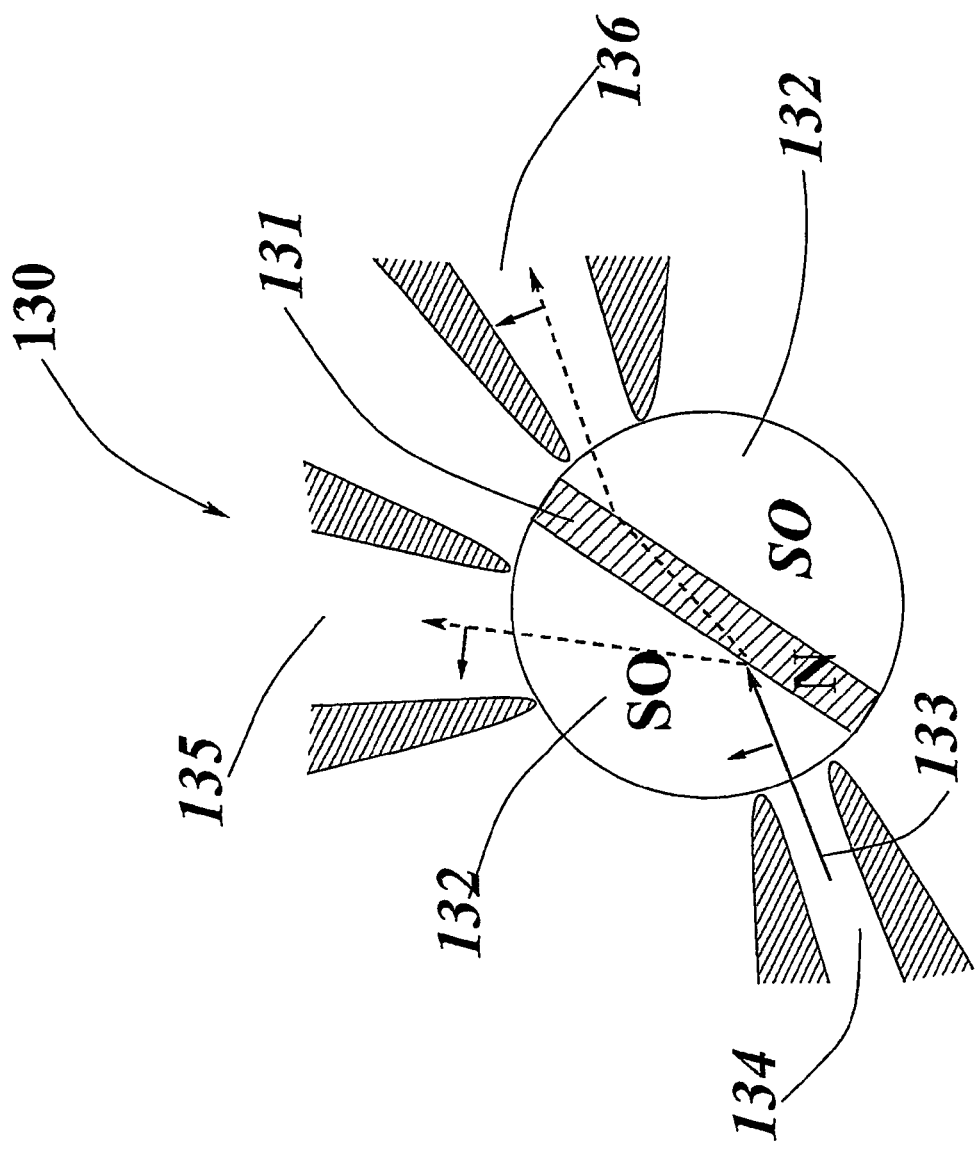
FIG. 13 exemplifies a switch of the current of spin carriers, according to the invention configured with a region of inhomogeneity formed by a stripe.

Referring to FIG. 13, a further example of implementation of a spintronic device 130 of the present invention is illustrated. In this example, the high sensitivity of the trajectories of electrons/holes near the angle for total internal reflection to the change of the magnitude of the spin-orbit coupling constant (or density provided that the spin-orbit coupling constant has a non-zero value) is exploited to obtain a switch of the spin current (or spin transistor). According to this example, the device 130 includes a semiconductor structure creating a stripe 131 with a reduced strength of the Rashba term (i.e., N-stripe) that is incorporated in an SO-region 132 in the gas. An input beam 133 of spin carriers is incident from a source 134 (injector terminal defined by two spaced-apart barriers) onto an SO—N interface in the gas with the angle of incidence close to the angle for total internal reflection. The device 130 also includes appropriately arranged collector terminals each defined by a pair of spaced-apart barriers—two such terminals 135 and 136 being shown in the present example. FIG. 13 actually presents the three-terminal switch device, with one terminal for supplying the current and two collectors switching the current therebetween.

It should be noted that the input flux of spin carriers may and may not be spin polarized. In the case when the input beam 133 is not spin polarized (unpolarized beam), the device 130 provides partial switching of the current. When the input beam 133 is spin polarized, the entire input flux (or dominant part of the input flux) can be switched. It should also be noted that the device can be configured to define an N—SO—N lateral configuration and the input beam of spin carriers can thus be incident on the N—SO interface, mutates mutandis.

The spin current can be switched between the terminals 135 and 136 by a small change of the spin-orbit density, with the bias voltage applied to a gate arranged near the stripe 131. It should be noted that the substantially rectangular shape of the transmission probabilities presented in FIG. 6 makes this device to be very sensitive to the modulation of the spin-orbit density constant by the bias voltage, or to be very sensitive to a change in the angle of incidence of the spin carrying current carriers on the stripe 131 by redirecting them. In this way, an effective modulation of the spin current can be achieved; thereby the direction of the current as well as the electrical resistance of the device can be controlled by altering the magnitude of the bias voltage. Thus, the device of this example can be used as a switch, when a change of the current direction is required. Likewise, the device of this example can operate as a transistor: by varying the spin-orbit coupling constant (via the bias voltage applied to the gate) the electric current at the collector can be controlled.

It should be noted that the time needed for switching the current in the above-described switch device 130 can be made extremely short. As it has been noted above, the bias voltage can modify the strength of the spin-orbit, while substantially not affecting the density of the two-dimensional gas 11 in the region 131 that is influenced by the gate. Hence, the change of the strength of the spin-orbit and subsequently the switch of the signal can be performed without recharging the two-dimensional gas. In this case the switching time of the switch device 130 can be much shorter than the switching time of the conventional switch devices based on the redistribution of charge. The time of changing the strength of the spin-orbit coupling without recharging the two-dimensional gas 11 can be extremely short as it is limited by the time of shifting location of the current carriers with respect to the interface here "inteace" is an interface between the two semiconductor layers with a different width of their band gaps and should not be confused with a lateral interface). This technique of current switching without substantial recharging the two-dimensional gas can be used for realization of a fast device with a very short scale of time of switching.

Figure 14:
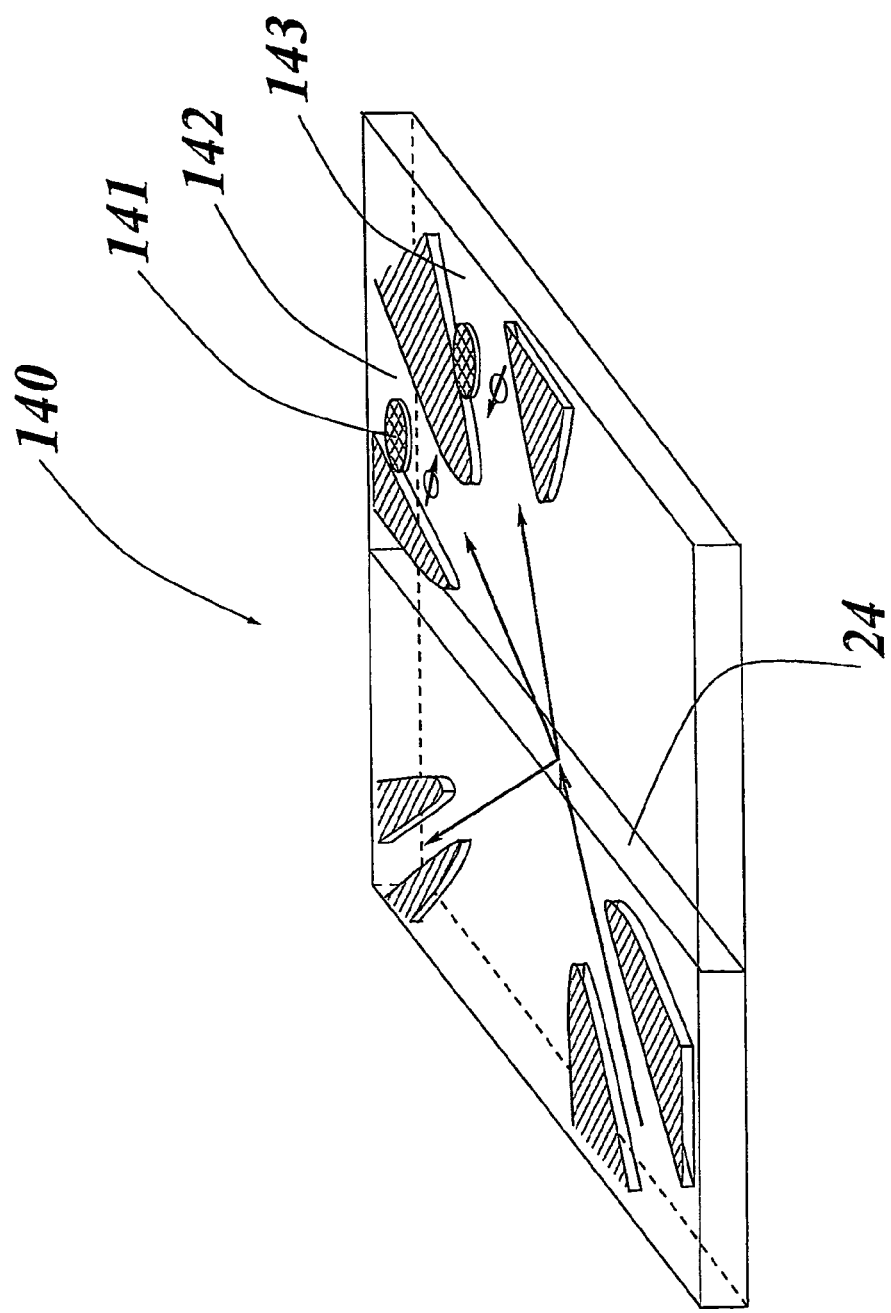
FIG. 14 exemplifies a spin-detector, according to the invention.

Referring to FIG. 14, yet another example of the implementation of a spintronic device 140 of the present invention is illustrated. According to this example, the spintronic device 140 can be used for the purposes of spin detection. In this case, the spatial separation of the trajectories of the spin carriers with different spin polarizations after passing across a lateral interface 24 (created in a two-dimensional gas structure as described above) is exploited for the construction of a detector of spin polarization of spin carriers. The device includes a charge sensor 141 (one or more such sensors) arranged to react on a charge of a spin carrying current carrier passing through a collecting terminal 142 (or 143). Examples of the sensor 141 applied for registration of a charged spin carrier passing through the terminal 142 include, but are not limited to, devices similar to a single electron transistor (SET) and a quantum dot located nearby the terminal. Combined with the fact that the spin carrier passing through the certain terminal 142 (or 143) has predetermined spin chirality, the device 140 can provide information sufficient for registering a spin polarization of passing spin carriers. Thus, the device of this example can be used as a spin detector for detection of spin polarization of spin carriers.

Figure 15:
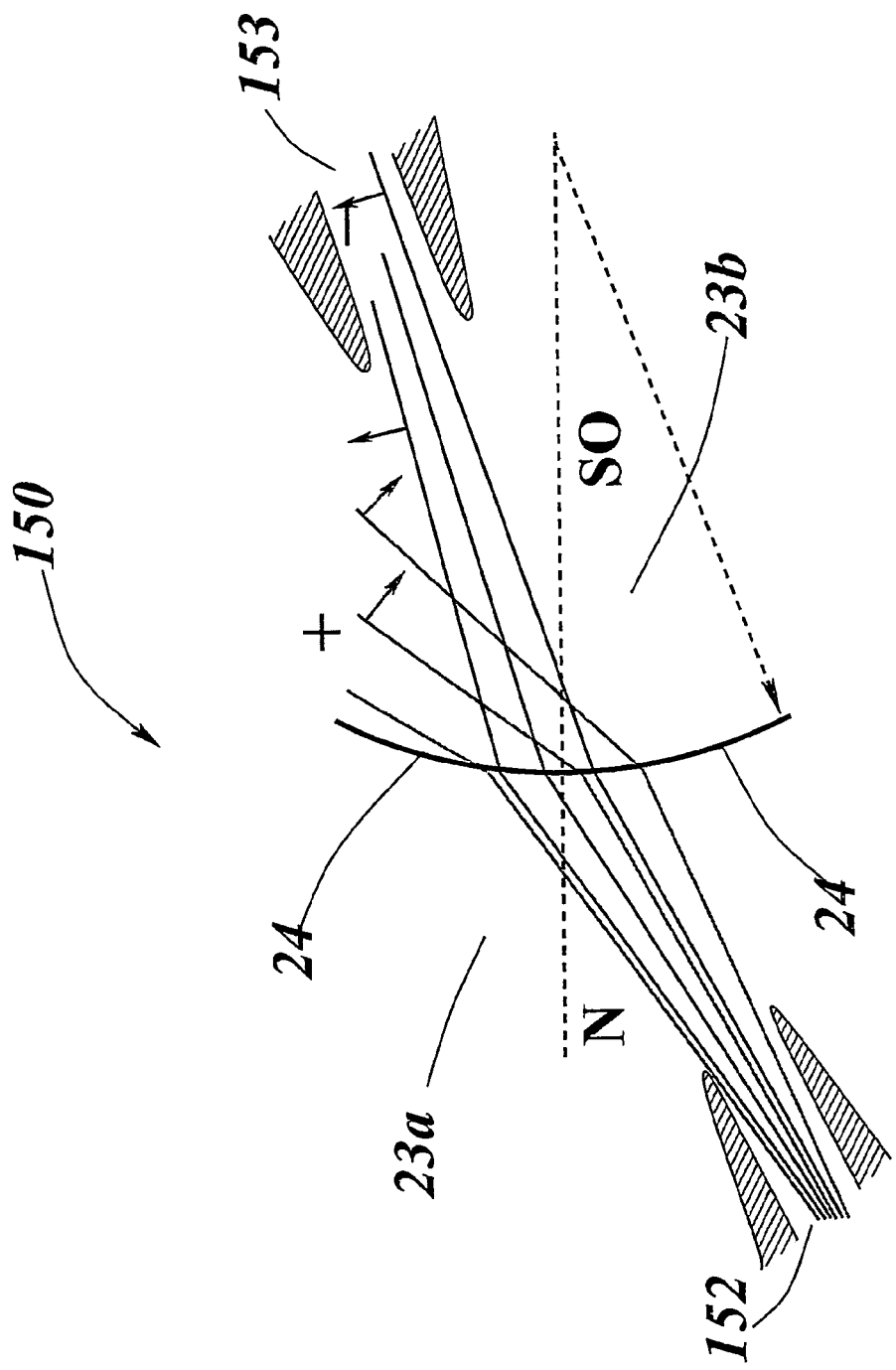
FIG. 15 exemplifies a realization of spin focusing the current of spin carriers by the region of inhomogeneity in the form of a lateral interface configured in an arc shape.

Referring to FIG. 15, there is illustrated a spintronic device 150 configured to be used for spin focusing of the spin carriers. In this case, a lateral interface 24 between regions 23a and 23b of the gas created in a semiconductor structure is configured to have an arced shape. The spin carriers emitted by an injector terminal 152 (defined by two spaced-apart barriers) after crossing the interface 24 are focused at a collector terminal 153 (defined by appropriately arranged spaced-apart barriers). It should be noted that although in this example (as well as in that of FIG. 18 described below) the shape (geometry) of the interface 24 is exemplified as arc-like or circular, generally it may be of any other curved geometry (e.g., parabolic) suitable for appropriately redirecting (focusing) the spin carriers impinging thereon.

It should be understood that the convex interface converges the spin carriers of "+" chirality incident on the interface 24 from the N-region (as shown in FIG. 15), while for the spin carriers of "−" chirality the concave interface would converge the spin carriers incident thereon from the N-region. It should also be noted that for the spin carriers incident from the SO-region, the situation is reversed, mutates mutandis.

Figure 16A:
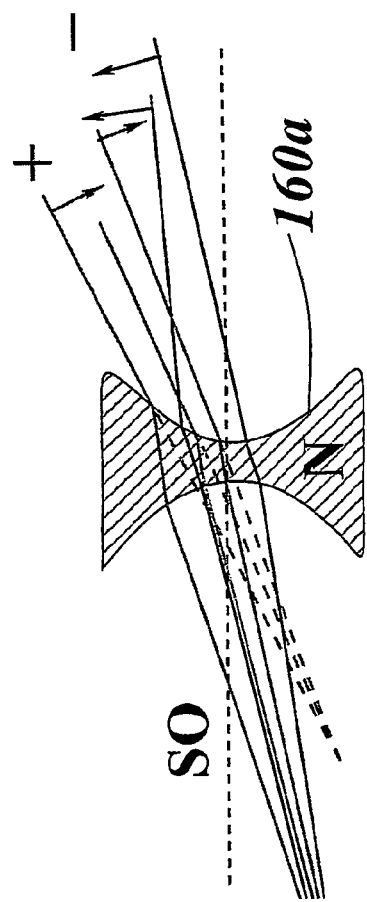
FIGS. 16A and 16B exemplify a realization of spin focusing the current of spin carriers by regions of inhomogeneity formed by lens-like regions of concave and convex shapes.
Figure 16B:
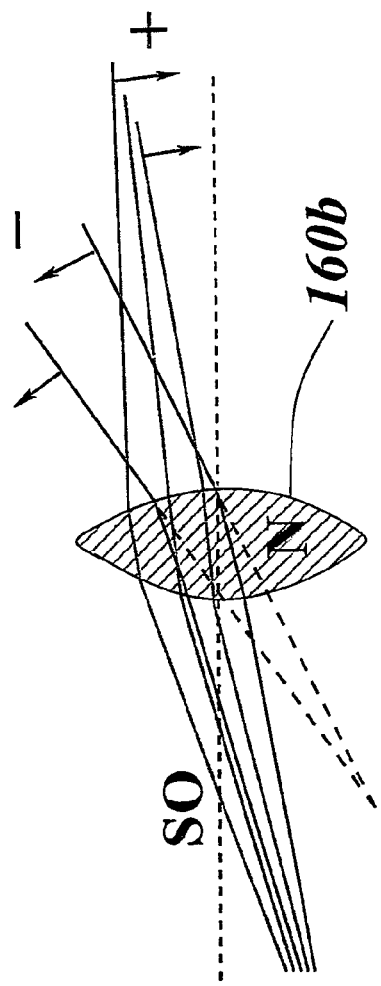

Referring to FIGS. 16a and 16b, yet other examples of implementation of the spintronic device according to the present invention are illustrated. In these configurations, the semiconductor structure containing the inhomogeneous two-dimensional gas 11 comprises the regions of inhomogeneity of the gas having concave 160a (FIG. 16a) and convex 160b (FIG. 16b) shapes, respectively, thereby forming concave and convex spin lenses for producing the spin focusing of spin carriers. It should be understood that such a region of the lens-like geometry presents the region of inhomogeneity with a reducing or increasing magnitude of the spin-orbit coupling constant or in general varying spin-orbit density (either continuously varying or not). This lens-like region with the varying spin-orbit density is either a relatively N-region or relatively SO-region as compared to its surroundings. A concave N-region inside an SO-region (spin lens 160a) converges the spin carriers of "−" chirality and diverges the spin carriers of "+" chirality. A convex N-region inside the SO-region (spin lens 160b) converges the spin carriers of "+" chirality and diverges the spin carriers of "−" chirality.

It should be noted that SO-regions inside N-region (not shown) would act oppositely, mutatis mutandis. It should also be understood, that by altering a bias voltage of the gate affecting the spin lens 160a and 160b, the focal distance of the spin lens can be changed and adjusted, as required.

Figure 17:
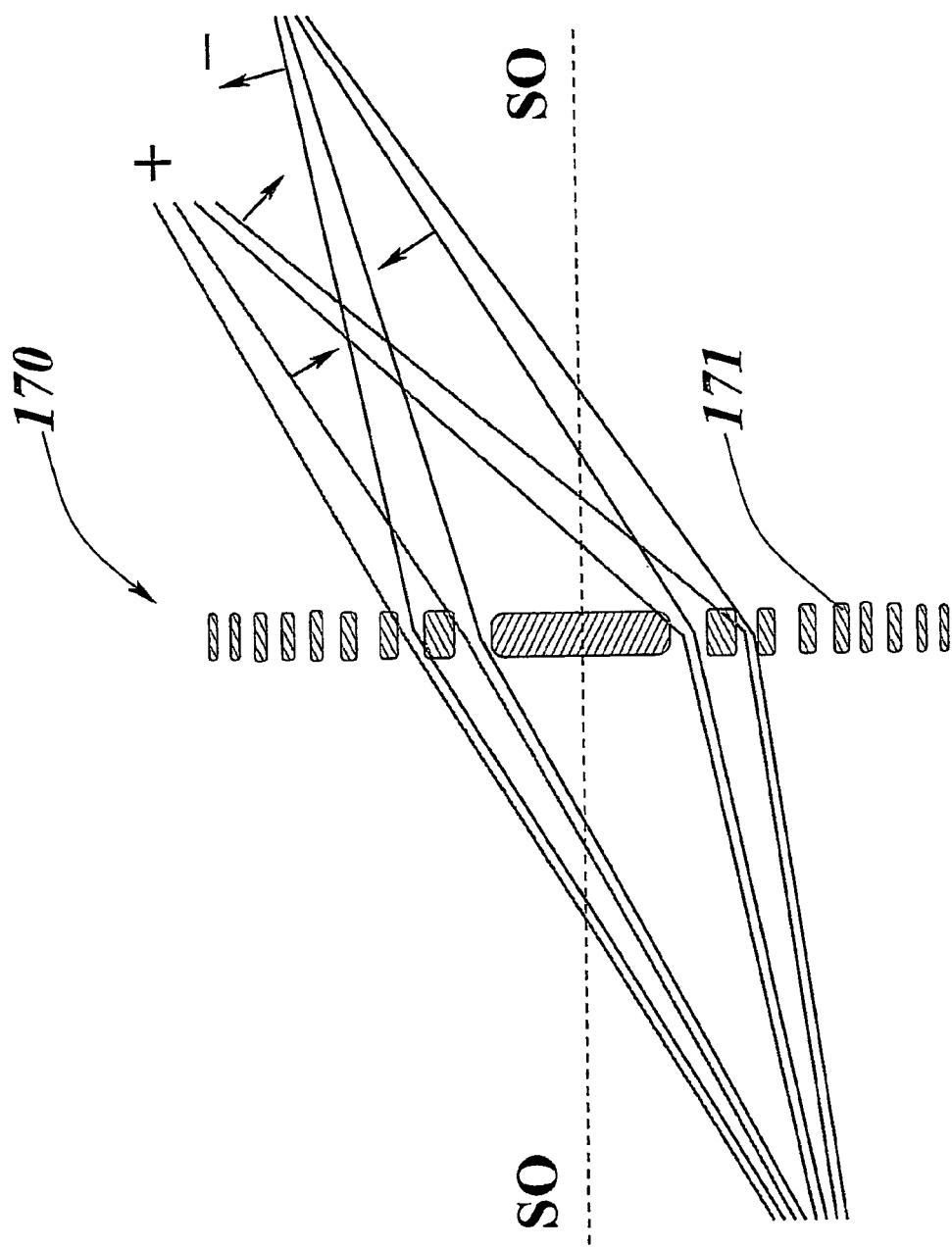
FIG. 17 exemplifies a realization of spin focusing the current of spin carriers by a spin zone lens.

Referring to FIG. 17, still another example of implementation of a spintronic device 170 of the present invention is illustrated. The spintronic device 170 includes a semiconductor structure which is configured to create a spin zone device by arranging regions of inhomogeneity in a spin zone pattern. In such a spin zone pattern, the regions of inhomogeneity 171 of the two-dimensional gas with the spin-orbit interaction can have vanishing density of the current carriers making the two-dimensional gas with the spin-orbit interaction (SO-gas) to be a multiply connected domain. Some of these regions of inhomogeneity 171 may for example be barriers. This device utilizes the effect of spin dependent diffraction in order to provide a spin zone device (which is an analog of the zone plate lens in optics). The spin zone device 170 can focus spin carriers of both "+" and "−" chiralities. It should be noted that the focal distances for different chiralities are different, i.e., the focal distance of the spin carriers of the "+" chirality is longer than that of the "−" chirality.

Figure 18:
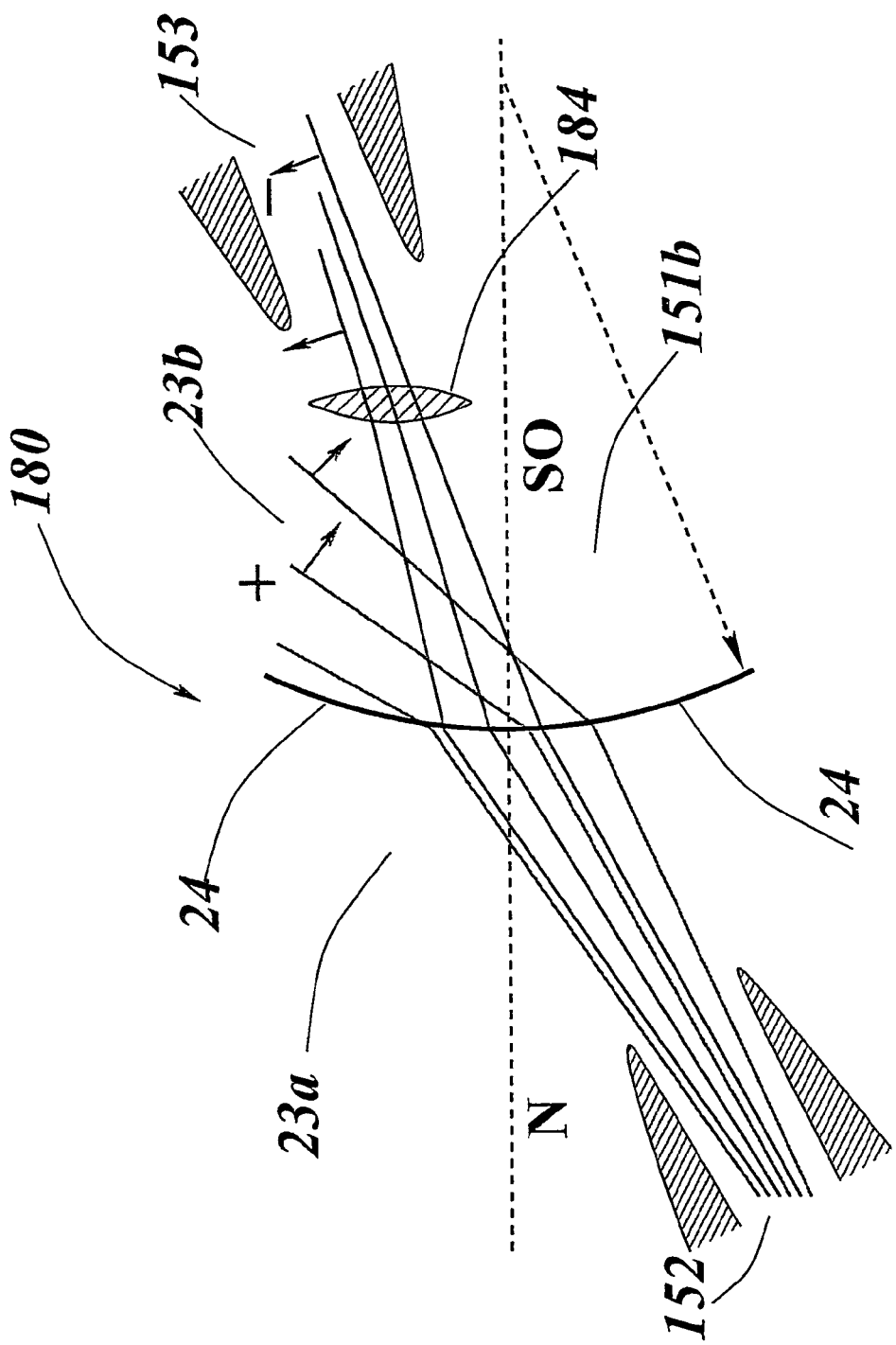
FIG. 18 exemplifies a realization of the telescopic effect in a spintronic device.

It should be understood that a combination of the embodiments of the spintronic device illustrated in FIGS. 15, 16a-16b and 17 can be provided. In this connection, reference is made to FIG. 18 illustrating a spintronic device 180, which is generally similar to that of FIG. 15 (accordingly the same reference numbers are used for identifying components that are common in these devices), and distinguishes from the device of FIG. 15 in that the focusing of the spin carriers is further corrected by a spin lens 184 formed as N-region in the SO-region 151b. The lens 184 provides the telescopic effect to enforce the spin polarization of the spin carriers to be parallel.

It should also be noted that other mechanisms can be used for spin focusing and redirecting the spin carriers. For example, a magnetic field can be used for the focusing and redirecting of the spin carriers in addition to the implementations of the spintronic device illustrated in FIGS. 15, 16a-16b, 17 and 18.

The above-described examples show various configurations of the semiconductor structure suitable for use in a spintronic device, utilizing at least one regions of inhomogeneity with a varying strengths of the spin-orbit interaction of the a two-dimensional gas of current carriers for manipulation of the direction of motion of the spin carriers.

The following is the description of another aspect of the invention providing for spreading a flux of the current carriers in a wide angular range of direction of motion thereby providing for splitting the input signal carried by the flux of the current carriers into multiple channels. According to this aspect, a semiconductor structure containing an inhomogeneous two-dimensional gas 11 of current carriers 12 is configured to create two regions of the gas, one region being diffusive (relatively low mobility determined by relatively high concentration of scattering centers), while the other region being "clean", i.e., ballistic (which may and may not be spin-orbit region). A current passing through the diffusive region of the gas "opens" into the ballistic region. The angular distribution of particles (current carriers) emitted into the ballistic region after passing through the diffusive region is broad, and the current carriers can be collected at different ranges of angles of propagation.

The invention provides for using the diffuse emission as a general method of realizing the wide-range-angle sparger for carriers (electron/holes) in nano-scale electronics. In particular, such a sparger can be used as an element for constructing a signal splitter for replicating an input signal. In addition, the inventors have shown that the emission in such configuration (diffuse emission) is an effective way to get current carriers (electrons and/or holes) propagating at small angles to the lateral interface in the two-dimensional gas that can be used for spin filtration.

Figure 19:
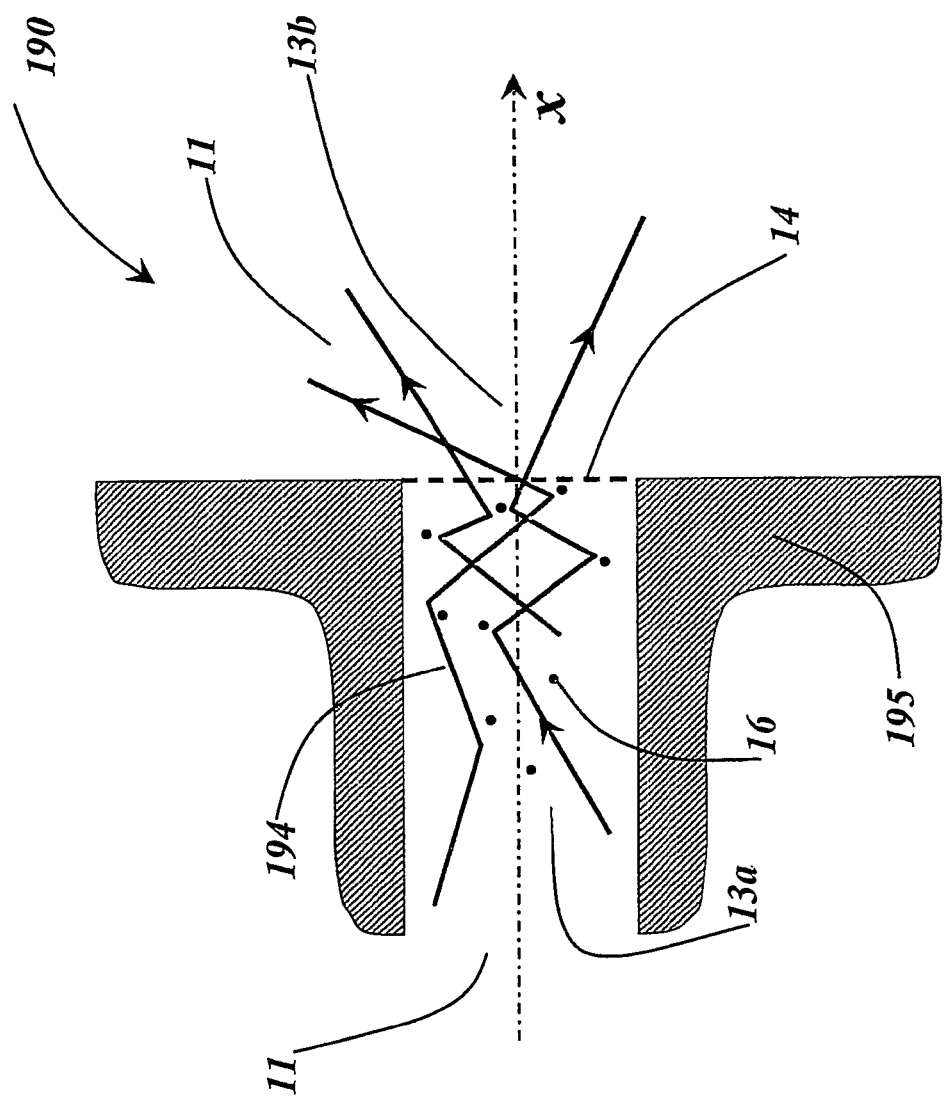
FIG. 19 shows an example of a structure of FIG. 1 configured to be operable as a wide-range-angle sparger according to the invention

Reference is made to FIG. 19 illustrating a diffuse-ballistic structure 190 of the present invention utilizing the concept of the diffuse emission in the inhomogeneous two-dimensional electron gas. The structure 190 provides for spreading particles (current carriers) in a wide range of angles when current carriers of the two-dimensional gas 11 pass from a diffusive region into a ballistic region.

The structure 190 includes a semiconductor structure configured to create a diffusive region 13a (scattering centers 16 are shown by dots) and a ballistic region 13b which are separated by a lateral interface (constituting a region of inhomogeneity of the two-dimensional gas) 14 therebetween. Generally, several techniques can be used to locally alter electron gas mobility for purposes of creating the inhomogeneous two-dimensional gas with laterally varying mobility. Examples of the techniques include, but are not limited to, electron beam irradiation, ion beam irradiation and implantation, local shallow etching (by wet etching, plasma etching or focused ion beam etching), local deposition or any combination thereof (see, for example, VLSI Handbook; Thin Film Processes II).

In FIG. 19 the diffusive region 13a is confined by barriers 195 (two spaced-apart barriers shown in the figure as shaded elements) to form an injector terminal of the structure. Barriers 195 can be formed in semiconductor structure by gates. Likewise, the barriers can be provided by known per se lithography, etching, deposition implantation and any other suitable technique.

In the diffuse-ballistic sparger structure 190, the current carriers passing through the diffusive region 13a are directed by scattering centers 16 to propagate in different direction in the ballistic region 13b. An example of the trajectory of a multiply-scattered particle is shown as 194. Thus, the structure 190 is configured as a wide-range-angle sparger of nanoparticles.

The following is the theory of diffuse emission which describes the passage of current carriers in the two-dimensional diffuse-ballistic structure 190. It should be understood that for the sake of clarity in the theoretical description presented below it is assumed that the density of the gas is the same in the diffusive and ballistic regions. However, this condition is optional, and does not limit the scope of the invention. For considering the kinetics of the diffuse emission (Milne problem) in the two-dimensional electron gas, the well established approach of the description of electrons by the kinetic equation was used. A distribution function $n_p(x)$ determining a stationary flow of electrons (current) satisfies the following equation:

$$\frac{\partial \varepsilon_p(r)}{\partial p}\frac{\partial n_p(r)}{\partial r} - \frac{\partial \varepsilon_p(r)}{\partial r}\frac{\partial n_p(r)}{\partial p} = St\{n_p(r)\}. \tag{8}$$

The electron flow is forced by the electric field, $\partial \varepsilon_p(r)/\partial r = e\nabla\Phi(r)$. In the linear response approximation one keeps terms linear in $\nabla\Phi(r)$ and $\delta n_p(r)$ only:

$$v_F \frac{\partial \delta n_p(r)}{\partial r} - e\nabla\Phi(r)v_F\frac{\partial n_F^0}{\partial \varepsilon} = St\{\delta n\}, \tag{9}$$

where $\delta n_p(r) = n_p(r) - n_F^0$ and $n_F^0$ is the Fermi-Dirac equilibrium distribution. The distribution function can be shifted by a local value of the potential $\Phi(r)$ introducing a function $f(r,\varphi)$ $$\delta n_p(r) = \frac{\partial n_F^0}{\partial \varepsilon}e[\Phi(r) - f(r,\varphi)], \tag{10}$$

where the angle $\varphi$ determines the direction of the momentum p. In terms of the function $f(r,\varphi)$, Eq. (9) acquires the form:

$$v_F\frac{\partial f(r,\varphi)}{\partial r} = St\{f\}. \tag{11}$$

The function $f(r,\varphi)$ determines the current as follows:

$$j(r) = 2e^2 v_{2D} \langle v_F(\varphi)f(r,\varphi) \rangle, \tag{12}$$

where $v_{2D}$ is the density of states per one spin species, $v_{2D} = m^*/2\pi$. In the diffusive region, the collision term is controlled by the elastic relaxation time $\tau_{el}$, and the kinetic equation acquires the form:

$$v_F\frac{\partial f(r,\varphi)}{\partial r} = St\{f\}_{elastic} \tag{13}$$

$$= -\frac{f(r,\varphi) - \langle f(r,\varphi)\rangle_\varphi}{\tau_{el}}.$$

In FIG. 19 the x-axis is directed perpendicularly to the interface 14 which separates the diffusive region 13a (x<0) and the ballistic region 13b (x>0); $-\hat{x}$ directs inwards the diffusive region.

With elastic mean free path $l = v_F \tau_{el}$ used as a unit of length, the kinetic equation can be rewritten in terms of the dimensionless variables $\zeta = x/l$:

$$-\cos\varphi\frac{\partial}{\partial \zeta}f(\zeta,\varphi) + f(\zeta,\varphi) = \langle f(r,\varphi)\rangle_\varphi. \tag{14}$$

Here, the sign "−" in the first term containing $\partial/\partial\zeta$ appears because $\varphi$ is chosen as an angle formed by a momentum with the direction $-\hat{x}(-\hat{x}$ directs inwards the diffusive region).

In the current carrying state electrons deep inside the diffusive region are distributed according to the Drude-form distribution. Correspondingly, at a distance (counted from the interface) exceeding a few mean free paths l, Eq. (14) has a solution:

$$f_{Dr}(\zeta,\varphi) = -J\pi^{-1}(\cos\varphi + \zeta). \tag{15}$$

Here, the factors are fixed in such a way that the current $J(\zeta)$ defined as $$J(\zeta) = -2\pi\langle\cos\varphi f(\zeta,\varphi)\rangle_\varphi \tag{16}$$

is equal to J for the distribution function $f_{Dr}(\zeta,\varphi)$. With the use of Eq. (12) the physical current $j \equiv j_x = -2e^2 v_{2D} v_F \langle\cos\varphi f(\zeta,\varphi)\rangle$ can be related to the current J defined in Eq. (16) as follows:

$$j = p_F(e^2/2\pi^2)J. \tag{17}$$

The relation between the current j and the electric field, $E = -\nabla\Phi$, is given by:

$$j = \sigma E - D_{ch}\nabla(e\delta\rho_{2D}), \tag{18}$$

where the conductivity is $\sigma = 2e^2 v_{2D}(l^2/2\tau)$, while the diffusion coefficient of charge density, $D_{ch}$, corresponds to the Einstein relation, $D_{ch} = (\partial\mu/\partial n)\sigma/e^2$. For a very wide class of geometries of the systems described here, the boundary condition which should be imposed on the incoming part of the function $f(x=0)$ takes the form $$f_{inc}(x=0) = \Phi(+\infty). \tag{19}$$

Together with the current distribution deep in the diffusive region, the above relation constitutes the full set of the boundary conditions needed for the solution of the kinetic equation (13). The condition $\Phi(+\infty) = 0$ is chosen and correspondingly $f_{inc}(x=0) = 0$ is used as the boundary condition for the function $f(r,\varphi)$ at the lateral interface between the diffusive and ballistic regions.

Angle φ for each of the two regions, diffusive ($\zeta<0$) and ballistic ($\zeta>0$), is chosen as an angle formed by a momentum of an electron with a normal to the interface directed inwards the corresponding region. Correspondingly, for $\mu=\cos\phi$ the convention is adopted that for electrons propagating away from the interface $\mu>0$ (denoted $+\mu$), while $\mu<0$ (denoted $-\mu$) corresponds to electrons propagating towards the interface.

The general solution of Eq. (14) above can be written as a sum of the Drude-form distribution function (see Eq. (15)) and $g(\zeta,\mu)$ which originates from the currentless "counter-flow" i.e., $f(\zeta,\mu)=f_{Dr}(\zeta,\mu)+g(\zeta,\mu)$. At a distance about few mean free path l, the counterflow $g(\zeta,\mu)$ approaches an isotropic distribution (generally, a nonzero constant). For currentless counterflow, particles injected into the diffusive region eventually return back to the interface. Hence the distribution function of particles emitted by the diffusive region, $g(-\mu)$, should be determined completely by the distribution function of the injected particles, $g(+\mu)$. Due to the linear nature of Eq. (14), the $g(\pm\mu)$ parts of the distribution function are related linearly by the angular Green's function $S(\mu,\mu')$:

$$g(\zeta,-\mu) = \frac{1}{\mu}\int_+ d\Omega' S(\mu,\mu')g(\zeta,+\mu'). \quad (20)$$

Here $d\Omega'$ stands for the angular integration in d dimensions, while the subscript + in the integral indicates that the integration is limited to the directions for which $\mu'>0$. With the use of Eq. (20), the density $\rho_g(\zeta)$ can be re-expressed corresponding to $g(\zeta,\mu)$ through the incoming part of the distribution only:

$$\rho_g(\zeta)=\int_+ d\Omega H(\mu)g(\zeta,+\mu) \quad (21)$$

where $$H(\mu) = \left[1 + \int_+ d\Omega' \frac{S(\mu,\mu')}{\mu'}\right]. \quad (22)$$

The Green's function $S(\mu,\mu')$ satisfies a non-linear integral equation:

$$S(\mu,\mu')\left(\frac{1}{\mu'}+\frac{1}{\mu}\right) = \frac{1}{S_d} H(\mu)H(\mu'), \quad (23)$$

where $S_d$ is a total solid angle in d-dimensions.

The Green's function $S(\mu,\mu')$ should satisfy the condition $$\mu=\int_+ d\Omega' S(\mu,\mu'), \quad (24)$$

that is a consequence of the conservation of particles.

The configuration of the structure of FIG. 19 is such that the distribution function in the ballistic region does not contain a component describing particles propagating towards the interface 14, i.e., $f(0,\mu)=0$. Therefore, in the solution $f(\zeta,\mu)=f_{Dr}(\zeta,\mu)+g_{Dr}(\zeta,\mu)$, the part $f_{Dr}(0,+\mu)$ has to be counterbalanced by a proper choice of $g_{Dr}(0,+\mu)=-f_{Dr}(0,+\mu)$. Then, the emission outside the diffusive region consists of the two contributions: $f_{Dr}(0,-\mu)$ from the Drude distribution function and $g_{Dr}(0,-\mu)$ which originates from the compensating counterflow. As $g_{Dr}(0,+\mu)$ is known, the latter contribution can be found with the help of Eq. (20). In result, the emission in the Milne problem is given by the expression $$f_M(0,-\mu) = J\frac{d}{S_d}\left[\mu + \frac{1}{\mu}\int_+ d\Omega'\mu' S(\mu,\mu')\right], \quad (25)$$

which can be simplified, and finally the angular distribution of the particles emitted from interface into the clean region is given by $$f_M(0,-\mu) = J\frac{\sqrt{d}}{S_d} H(\mu). \quad (26)$$

In the considered case there are no reflection at the interface and therefore the solution $f_M(0,-\mu)$ determines the angular distribution of the particles emitted into the ballistic region, i.e., $f(\theta)=f_M(0,-\mu)$.

In the structure configuration of FIG. 19, the current is sent to a distance larger than the width W of the diffusive region 13a. Under this condition, the orifice of the region acts as a source of a current with an angular distribution $f(\theta)$. The number of electrons moving in a direction θ per unit time (i.e. the angular flux) is equal to $I(\theta)d\in d\theta$, where the intensity $I(\theta)$ is related to $f(\theta)$ as $$I = \frac{e^2}{(2\pi)^2} p_F f(\theta)\cos\theta W.$$

The factor $\cos\theta W$ appears because the flux of the particles outgoing from the orifice at an angle θ is considered.

The result (26) coincides with the one presented in textbook P. M. Morse and H. Feshbach, *Methods of Theoretical Physics* for the case d=3.

Figure 20:
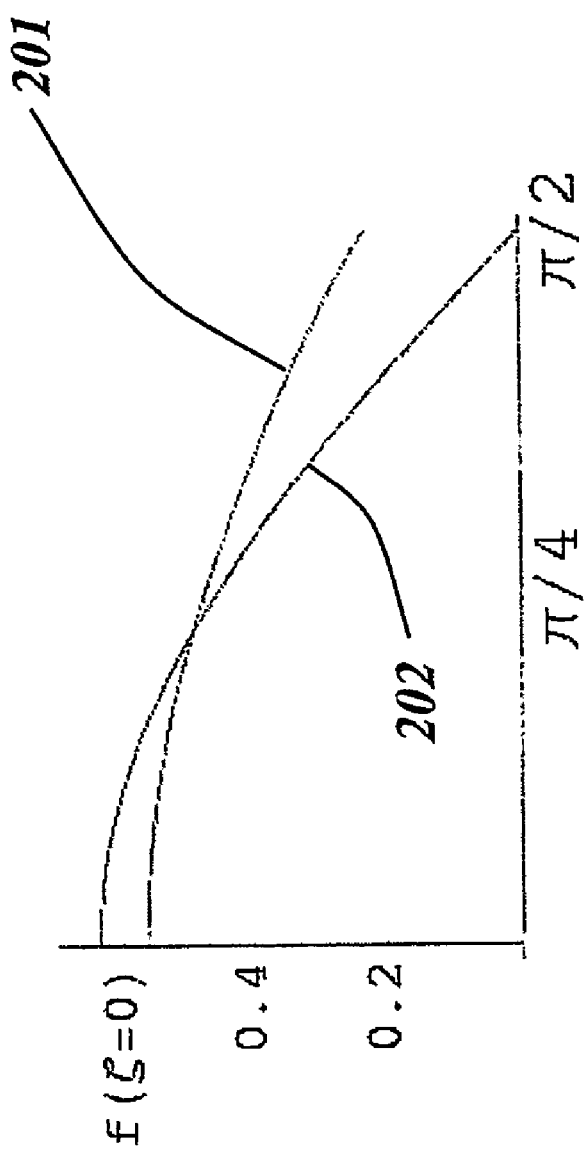
FIG. 20 illustrates the angular distribution of the diffuse emission in the two-dimensional semiconductor structure as compared to the Drude-form distribution.

FIG. 20 presents the function $$f(\theta) = \frac{1}{\sqrt{2}\pi} H(\cos\theta),$$

curve 201, found for the first time for a particular case of interest d=2 together with the angular dependence of the Drude distribution function, curve 202, both normalized to J=1. As compared to the Drude distribution function, the diffuse emission distribution in the Milne problem has qualitatively different behavior at large angles. By making one of the two regions connected by the lateral interface to be diffusive, a flat angular distribution of particles emitted from the diffusive region into the "clean" one can be achieved. Namely, the distribution flattens and a considerable part of the distribution is transferred to the large angles.

Thus the present invention provides for using the diffuse emission as a general method of realizing the wide-range-angle sparger for carriers (electron/holes) in nano-scale electronics. A current passing through a diffusive region opens into the ballistic region. The angular distribution of emitted particles (carriers) is broad, and the particles can be collected at different angles. According to the present invention, this may be used in signal splitters for the purpose of replicating a signal to multiple channels. To this end, the current carriers are emitted in a wide-angular range of directions in the ballistic region, with the subsequent angle resolved collecting of the carriers at the terminals of said multiple channels. The collector terminals of the channels should be appropriately distributed at different angles around the current source (in the configuration of the sparger structure 190 the diffusive region 13a acts as an injector terminal) so as to collect the fluxes of the carriers at desired angles. The device of the present invention is thus operable as a wide-range angle sparger spreading nano-particles in different directions.

In addition, in certain cases, for example for the purposes of spin manipulations, the most sensitive to the external control are the current carriers which propagate almost parallel to a lateral interface between two regions of the two-dimensional electron gas. In this case, the sparger device of the present invention is to be configured to deliver a significant portion of the carriers almost parallel to the lateral interface.

Figure 21:
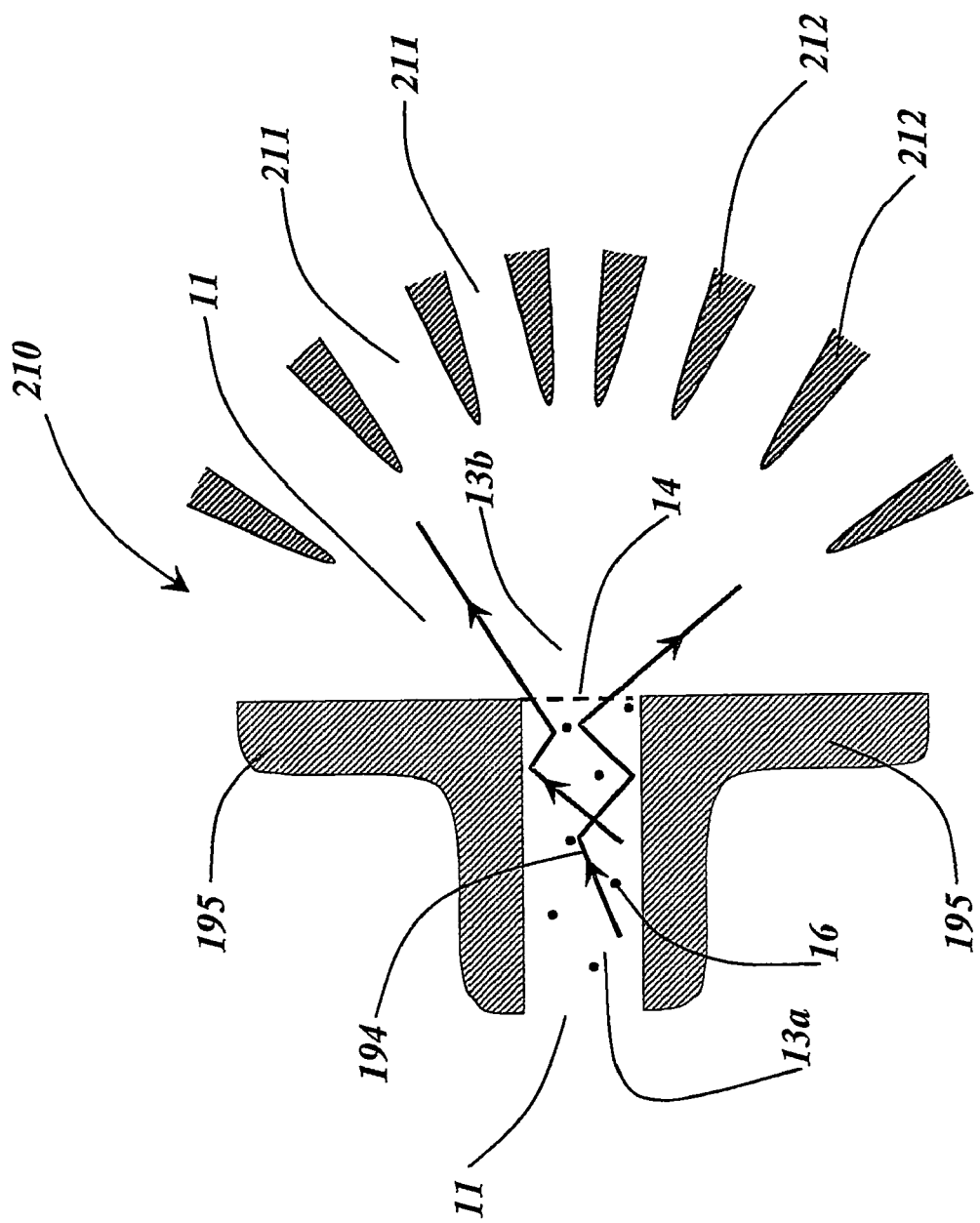
FIG. 21 schematically illustrates a signal splitter device of the present invention utilizing the wide-range-angle sparger of FIG. 19.

FIG. 21 shows an example of a device 210 of the present invention exploiting the wide-range angle of spreading in different directions of nano-particles in a diffuse-ballistic structure of FIG. 19. The device 210 is configured to act as a signal splitter (signal replicator) which splits an input signal (current) into multiple channels (associated with multiple terminals), generally at 211, defined by an array of barriers 212. It should be noted that the configuration of the channels (terminals) 211 in this example is given for the illustration purposes and does not limit the invention to a number of such channels and/or their angular distribution, which depend in a specific application of the device aimed at collecting the carriers at desired locations. The signal splitter device 210 includes a semiconductor structure containing a two-dimensional gas 11 configured to create a diffusive region 13a and a ballistic region 13b in two-dimensional gas; barriers 195 associated with region 13a which define an injector terminal in region 13a; and an array of barriers 212 (e.g., circular array) defining collecting terminals 211, configured for collecting particles within the ballistic region 13b in the broad interval of angles. An example of trajectory of a particle is shown generally at 194. Each of the collecting terminals 211 is configured to operate as an independent channel to allow further processing of the signal. Barriers 195 and 212 (shown in the figure as shaded elements) can be formed in the semiconductor structure by gates. Likewise, the barriers can be provided by known per se lithography, etching, deposition implantation and any other suitable technique.

As indicated above, the ballistic region may and may not be spin-orbit. The following is the generalization of the solution of the Milne problem to the case of the spin-dependent reflection at the interface. The influence of the strong reflection at the angles tangential to the interface on the distribution of the emitted electrons is considered in the case when the ballistic region may be spin-orbit. The inventors have shown that the effect of flattening of the angular distribution is the robust property of the solution of the Milne problem which becomes even stronger in the presence of such reflection.

In order to calculate the diffuse emission in the presence of the spin-orbit interaction at the ballistic side of the junction, as compared to the consideration in the description above (relating to no spin-orbit interaction in the ballistic region of the gas), the dependence of scattering at the interface on the direction of spin of the incoming electron is to be taken into account. On the other hand, electrons after a sequence of random scattering in the diffusive region return to the interface preserving their spin, as the impurity scattering of electrons in the diffusive region is assumed to be spin-independent.

In the case of the spin dependent scattering at the lateral interface, two functions $f^\pm$ should be introduced describing the distribution functions of electrons of the "+" and "−"
chirality, respectively. In the diffusive region, each component of the spin density matrix satisfies the kinetic equation (14) because in the normal (ballistic) region the Hamiltonian is spin-independent. Consequently, the same angular Green's function $S(\mu,\mu')$ as in Eq. (20) can be applied.

The equation determining the functions $f^\pm$ has the form analogous to Eq. (25) describing the process of the counterflow at the interface. Here, however, because of the reflection at the N—SO interface, the relation (25) should be replaced by the selfconsistent equations. In the case of the function $f^+$ the selfconsistent equation can be written in the form:

$$f_N^+(-\mu) = J\frac{1}{\sqrt{2}\pi}H(\mu) + \frac{1}{\mu}\int_0^{\cos\varphi_c}\frac{d\mu'}{\sqrt{1-\mu'^2}}S(\mu,\mu')(1-\mu\mu')f_N^+(-\mu'). \tag{27}$$

This equation has a structure similar to that of Eq. (25), but due to the reflection at the interface the counterflow depends on the distribution of the incident particles. As a result, the right hand side of the equation depends selfconsistently on the function distribution $f_N^+(-\mu)$. In Eq. (27) the integrals are limited by the angle for total internal reflection $\phi^c$. Here, one uses the fact that for a smooth interface, the particles of the "+" chiral state when incident on the interface are reflected totally if the angle of incidence $\phi$ exceeds $\phi^c$. In addition, it has been taken into consideration that no change of the chirality occurs as a result of the reflection at the interface, and that the particles with $\phi<\phi^c$ are not reflected. It should be noted that these assumptions being rather realistic are taken for the purposes of the illustration only, and by no means limit the subject of the invention.

In the same way, the distribution of particles in the "−" chiral state is given by the following equation:

$$f_N^-(-\mu) = J\frac{1}{\sqrt{2}\pi}H(\mu) + \frac{1}{\mu}\int_0^{\cos\varphi_c}\frac{d\mu'}{\sqrt{1-\mu'^2}}S(\mu,\mu')(1+\mu\mu')f_N^-(-\mu'). \tag{28}$$

In the following, the results of numerical analysis for the distribution functions $f_N^\pm(-\mu)$ will be used.

Ultimately, the distributions on the SO side of the interface is to be determined. To this end, the calculated distributions $f_N^\pm$ are to be connected to the distributions on the SO side $f_{SO}^\pm$. It follows straightforwardly from the Liouville's theorem that $$f_{SO}^\pm(\epsilon,+\mu_\theta)=f_N^\pm(\epsilon,-\mu_\phi), \tag{29}$$

where $\mu_\theta$ and $-\mu_\phi$ are two directions connected by the Snell's law.

In the description below, the notations $f_{SO}^\pm(\theta)$ and $f_N^\pm(\phi)$ will be used instead of $f_{SO}^\pm(\epsilon,+\mu_\theta)$ and $f_N^\pm(\epsilon,-\mu_\phi)$; it should be noted that we return to the definition of angles $\phi$ and $\theta$ as it is given in FIG. 3.

Figure 22:
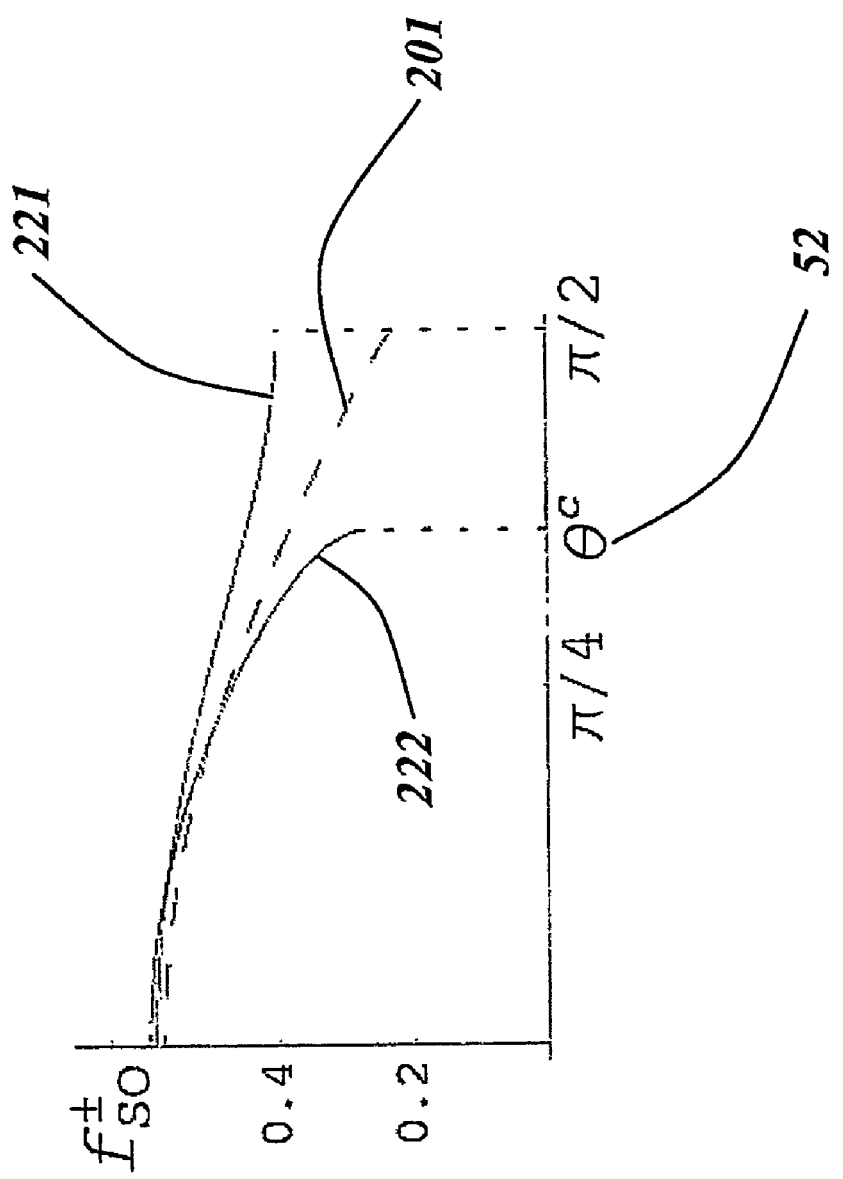
FIG. 22 illustrates the distribution function of the "+" and "−" polarization components of the two-dimensional electrons emitted into the ballistic region after passing through the diffusion region.

In FIG. 22 the result for $f_{SO}^+(\theta)$ is shown by a curve 221 and for $f_{SO}^-(\theta)$, by a curve 222. The function $f_{SO}^\pm(\theta)$ of the "+" and "−" polarization components of the transmitted electrons for $\tilde{\alpha}=0.1$ are shown as compared with the solution without reflection, $\tilde{\alpha}=0$ (dashed line in FIG. 22), i.e., the solution of the diffuse emission problem in two-dimensions given in FIG. 20 by the curve 201. The distribution of particles of the "+" chirality emitted from the diffusive region into the clean one is flat even in the presence of the spin-dependent reflection at the interface.

It has been verified that the specific property of the solution of the Milne problem (the flattening of the angular distribution of the emitted electrons) is the robust property of the diffuse emission which holds despite the presence of a spin-dependent reflection at the interface. Moreover, as it is demonstrated in FIG. 22, at large angles the distribution function of electrons of the + chirality $f_{SO}^+(\theta)$ is noticeably increased. As indicated above, there exists an interval of the outgoing angles, $\theta^c < \theta < \pi/2$, where only the "+" spin chiral component can penetrate (the angle $\theta^c$, 52, is the maximal angle of refraction of the electrons of "−" chirality). Together with the existence of a large portion of electrons emitted at small angles to the interface, it means that the diffuse emission can be used for the purposes of spintronics.

Figure 23:
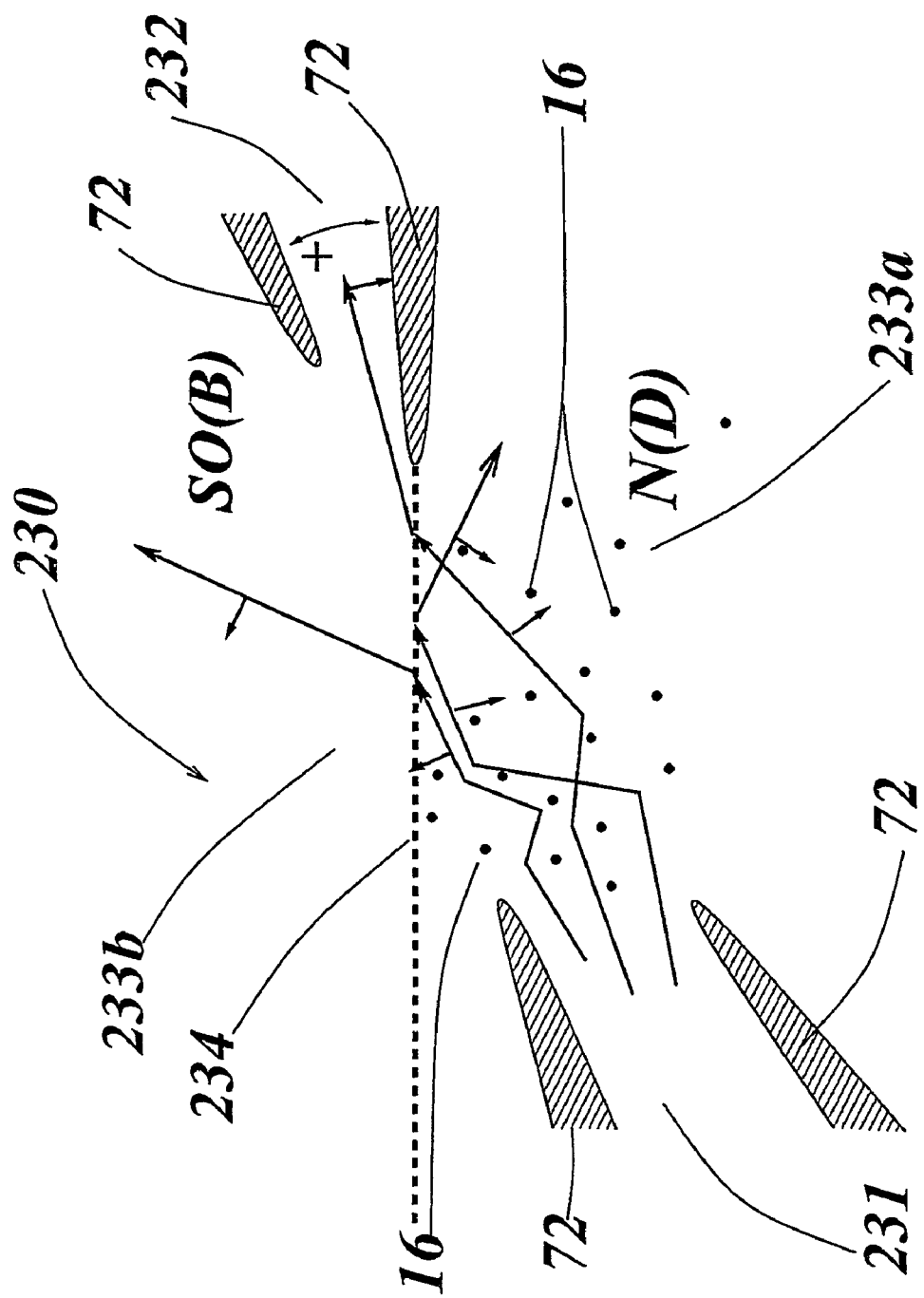
FIG. 23 schematically illustrates an example of a spin filter of the present invention when the electrons are injected from the diffusive part of the two-dimensional gas into the ballistic spin-orbit part.

Reference is made to FIG. 23 showing schematically a spintronic device 230 of the present invention for producing the spin polarization current of spin carriers. The device 230 includes a semiconductor structure configured to create a normal (with a reduced spin-orbit term) diffusive (relatively low gas mobility) region N(D) 233a, and a ballistic (relatively high mobility) spin-orbit region SO(B) 233b. Unpolarized particles are provided by an injector 231 defined by barriers 72. A collector 232 is defined by two additional barriers 72 (or gates). The collector is configured such as to collect only carriers with a proper spin-polarization. Hence, for the carriers emitted from the diffusive region 233a, after passing across a lateral interface zone 234 between regions 233a and 233b only carriers with the proper spin-polarization can reach the collector 232 (in the figure the proper spin polarization is indicated as "+"). In the spintronic device 230, the scattering centers 16 (are shown by dots) in the region 233a direct the spin carriers to the interface at a wide range of angles, as this region is diffusive. The device 230 operates as a spin filter for a current sent by the injector 231. Only the particles that have a proper spin polarization can reach collector 232, thereby providing the spin filtered current in the collector 232. The spin filter device 230 is a modification of its ballistic analogue presented in the above-described FIG. 8. By making the N-region (23a in FIG. 8) to be diffusive, a requirement to injector to send particles in the preferable range of angles can be relaxed.

Figure 24:
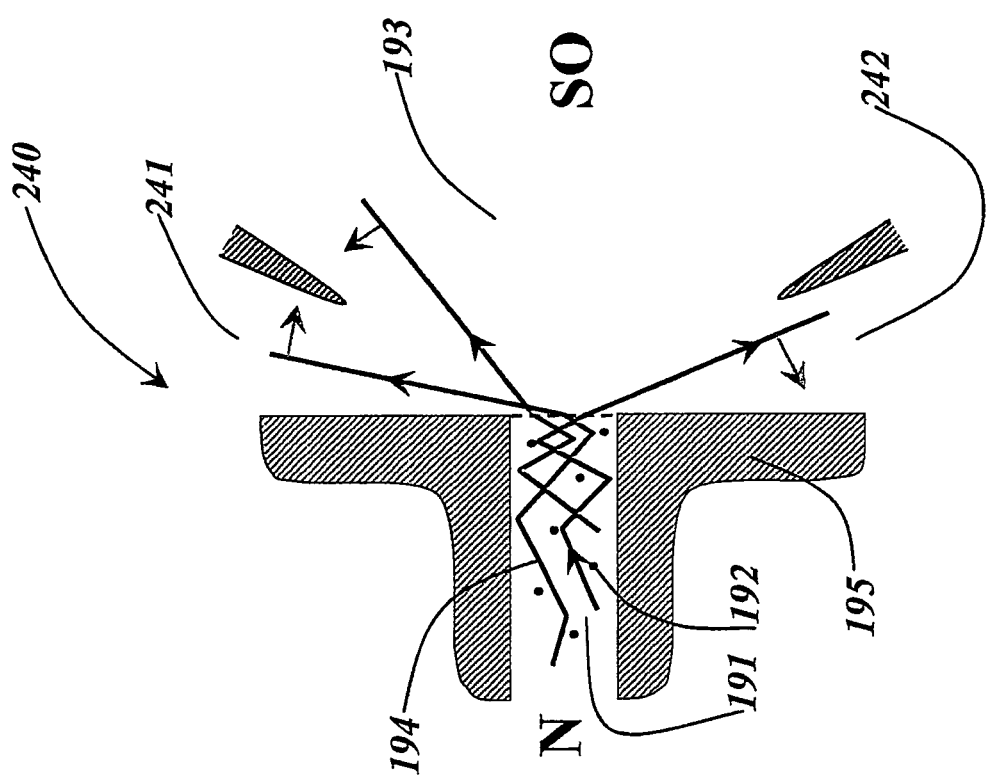
FIG. 24 schematically illustrates yet another example of implementation of a spin filter of the present invention when one of the parts of the spintronic structure is configured as the wide-range-angle sparger.

FIG. 24 illustrates yet another example of a spintronic device 240 for producing the spin polarization current of spin carriers. The device 240 utilizes, for the purposes of spintronics, the principle of the diffuse-ballistic sparger illustrated in FIGS. 19 and 21 where the gas in the ballistic region has relatively high spin-orbit coupling constant (SO region). In the device 240 the effect of the diffuse emission providing a flux of the current carriers scattered at wide interval of angles is exploited to obtain the spin polarized currents of the oppositely directed spins. The geometry of the setup is such that each collector 241a (defined by barriers 195a and 243) and collector 241b (defined by barriers 195b and 242) gets spin carrying current carriers emitted into the corresponding angular interval $\delta\theta$. When $\delta\theta < \pi/2 - \theta^c$, only particles of the "+" chirality can get into the collectors 241a and 241b. As a result, the collectors 241a and 241b get the spin polarized currents with the oppositely directed spins.

Assuming the angular distribution of the emitted electrons to be practically flat, the spin-polarized current that can be collected by each of the collectors is $\approx j\delta\theta^2/8$. As explained above, the width of the angular interval $\delta\theta = \pi/2 - \theta^c$ can be as much as $2\sqrt{\tilde{\alpha}}$. At this point the fraction of spin-polarized current reaches its optimal value $\approx j\tilde{\alpha}/2$. All collected electrons have the same chirality that results in a very high level of spin polarization of the current in the collectors. A deviation from the perfect level of spin-polarization is only due to a small spread of the direction of motion of electrons within an angular interval $\delta\theta$.

In the experiments by Sato et al. (Y. Sato, T. Kita, S. Gozu, and S. Yamada, *Journal of Applied Physics*, Vol. 89, P. 8017, 2001) a large spontaneous spin splitting has been detected in a gate controlled electron gas formed at an $In_{0.75}Ga_{0.25}As/In_{0.75}Al_{0.25}As$ heterojunction. The reported splitting corresponds to $\tilde{\alpha} \approx 0.1$. For such values of $\tilde{\alpha}$ one may expect a rather large angular interval $\delta\theta$ that can be used for spin filtration; $\delta\theta \approx 36°$. Under these conditions, the device of FIG. 24 operates as follows: a fraction up to 5% of the total current is collected in terminal 241a and is (almost) fully spin-polarized along the direction $\hat{x}$, while the other fraction of 5% is collected in terminal 241b and is spin-polarized along the direction $-\hat{x}$. After filtration, the spin-polarized current can be manipulated similarly to the polarized light in optical devices. In particular, the spin filter can be linked to the switch of the spin-polarized current.

Those skilled in the art to which the present invention pertains, can appreciate that while the present invention has been described in terms of preferred embodiments, the concept upon which this disclosure is based may readily be utilized as a basis for the designing of other structures, systems and processes for carrying out the several purposes of the present invention.

Although the examples presented above utilize the spin dependent refraction, reflection and diffraction, a person versed in the art can appreciate that other examples of the spin manipulation utilizing, inter alia, spin dependent interference (e.g., quarter wave stripes, Fabry-Perot interferometer, etc) can also be implemented.

Although the examples of the utilization of the current carriers' manipulator device of the present invention are shown as independent modules (such as spin polarizer, filter, guide, storage, switch, spin detector, spin lenses and spin zone plate), the spintronic device of the invention can also be used as a component of a spintronic circuit.

Also, it is to be understood that the phraseology and terminology employed herein are for the purpose of description and should not be regarded as limiting.

It is important, therefore, that the scope of the invention is not construed as being limited by the illustrative embodiments set forth herein. Other variations are possible within the scope of the present invention as defined in the appended claims and their equivalents.

The invention claimed is:

1. A device for manipulating a direction of motion of current carriers, the device comprising
   a structure containing a two-dimensional gas of the current carriers configured to create at least one region of inhomogeneity in the form of a transition region between two regions of the gas characterized by a substantially varying value of at least one parameter selected from a spin-orbit coupling constant, and density of the spin carrying current carriers,
   said region of inhomogeneity presenting a lateral interface with laterally varying parameters between the two gas regions, wherein:
   said structure is configured to provide the two-dimensional gas configuration with a desired orientation between an input flux of the spin carrying current carriers and said at least one region of inhomogeneity, which has the varying spin-orbit coupling constant and/or has the varying density of the spin carrying current carriers provided the spin-orbit coupling constant is of non-zero value, said desired orientation being such that the input flux of the spin carrying current carriers contains the carriers that impinge onto said at least one region of inhomogeneity at a certain range of non-zero angles of incidence, the device being thereby operable to perform spin manipulations of the input flux to provide at least one of the following types of deviation of said spin carrying current carriers: spin dependent refraction, spin dependent reflection and spin dependent diffraction on desired deviation angles of a direction of motion of the spin carrying current carriers being incident on said at least one region of inhomogeneity.

2. The device of claim 1 wherein said structure is configured such that the inhomogeneous two-dimensional gas is confined by at least one potential well.

3. The device of claim 2 wherein the potential well is created in a semiconductor structure.

4. The device of claim 3 wherein said structure is a semiconductor heterostructure.

5. The device of claim 1 wherein said structure is configured such that the inhomogeneous two-dimensional gas is confined by at least one nonuniform potential well.

6. The device of claim 5 wherein at least one portion of said at least one nonuniform potential well is an asymmetrical potential well.

7. The device of claim 5 wherein at least one part of the structure is fabricated from a uniaxial crystal compound with no inversion symmetry.

8. The device of claim 5 wherein the nonuniform potential well is created in a semiconductor structure.

9. The device of claim 8 wherein said structure is a semiconductor heterostructure.

10. The device of claim 9 wherein the semiconductor heterostructure is fabricated from compounds selected from group III - group V, and group II - group VI compounds.

11. The device of claim 10 wherein the semiconductor heterostructure is selected from $In_xGa_{1-x}As/In_yAl_{1-y}As$, $In_xGa_{1-x}As/InP$, $InAs/AlSb$, $In_xAl_{1-x}As/In_yGa_{1-y}As/In_zAl_{1-z}As$, $CdTe/HgTe/CdTe$ and $Hg_xCd_{1-x}Te$.

12. The device of claim 11 wherein x, y and z are in the range of about 0.1 to 1.

13. The device of claim 1 comprising at least one gate configured for applying a bias voltage thereto, said bias voltage being sufficient to change said at least one parameter in a region of the two-dimensional gas near said at least one gate to thereby create the region of inhomogeneity.

14. The device of claim 1 wherein the varying of the spin-orbit coupling constant of the gas within the region of inhomogeneity of the gas measured in units of Fermi velocity is larger than about 0.001.

15. The device of claim 1 wherein the current carriers are selected from electrons and holes.

16. The device of claim 1 comprising at least one injector terminal and at least one collector terminal distant from each other, each terminal being defined by a space between two nearest barriers arranged in said structure, the terminals being arranged for allowing the carriers passage from the injector terminal to the collector terminal.

17. The device of claim 1 comprising at least one injector terminal and at least one collector terminal distant from each other, each terminal being defined by a space between two nearest barriers arranged in said structure, the terminals being arranged for allowing the carriers passage from the injector terminal to the collector terminal.

18. The device of claim 17 wherein said at least one injector terminal is configured for providing the input flux of unpolarized spin carrying current carriers, and said at least one collector terminal is configured for receiving a current of spin-polarized spin carrying current carriers, the device being therefore configured and operable as a spin filter for producing a current of spin carriers having the predetermined spin polarization.

19. The device of claim 17 wherein said at least one injector terminal is configured for providing the input flux of unpolarized spin carrying current carriers, and the at least two collector terminals are configured, each for receiving currents of the spin polarized spin carrying current carriers, the device being therefore configured and operable as a spin polarization splitter.

20. The device of claim 19 comprising a charge sensor arranged at said at least one collector terminal and configured for receiving a flux of the spin carrying current carriers having the predetermined spin polarization; the device being thereby configured and operable as a spin detector for detecting a spin polarization of the spin carriers.

21. The device of claim 1 wherein said structure is configured to create the region of inhomogeneity in the form of a lateral interface between two regions of the gas having different values of the spin-orbit coupling constant and/or different values of the density of the spin-carrying current carriers provided the spin-orbit coupling constant is of a non-zero value in at least one of these regions.

22. The device of claim 21 wherein said lateral interface has a curved geometry.

23. The device of claim 1 wherein said structure is configured to define the region of inhomogeneity of the gas having regions of concave and/or convex shapes with a relatively reduced or relatively enhanced spin-orbit coupling constant and/or the density of the spin-carrying current carriers as compared to the gas surroundings of said lens-like region.

24. The device of claim 1 wherein the region of inhomogeneity is configured as a spin zone pattern so as to provide for focusing the input flux of the spin-carrying current carriers based on the spin dependent diffraction.

25. The device of claim 1 wherein said structure is configured to create the region of inhomogeneity in the form of an elongated stripe which has the relatively reduced or relatively enhanced spin-orbit coupling constant and/or the density of the spin-carrying current carriers as compared to the gas surroundings of said stripe.

26. The device of claim 25, wherein said desired orientation is such that at least one spin polarization component of the input flux of the spin-carrying current carriers undergoes total internal reflection while passing along the stripe.

27. The device of claim 25, wherein said desired orientation is such that the at least one polarization component of the input flux of the spin-carrying current carriers undergoes total internal reflection while passing through the stripe.

28. The device of claim 25 wherein said stripe has a curved geometry.

29. The device of claim 28 wherein said stripe has a closed loop shape.

30. The device of claim 1 wherein said at least one region of inhomogeneity of the gas is configured for redirecting the spin carrying current carriers, thereby to provide a spin focusing of the spin carrying current carriers.

31. The device of claim 1 wherein said at least one region of inhomogeneity of the gas is configured for guiding the spin polarized spin carrying current carriers along said region of inhomogeneity of the gas owing to the total internal reflection of the spin carrying current carriers to convey the spin current to a predetermined location in the device, to thereby provide a spin guide.

32. The device of claim 31 wherein said spin guide is configured in the shape of a closed loop having an entrance and at least one exit; to thereby provide a spin storage of the spin carrying current carriers.

33. The device of claim 1 further comprising a gate configured for altering a bias voltage being sufficient to affect said inhomogeneous two-dimensional gas of spin carrying current carriers, said bias voltage being applied to the gate for switching the deviation angles of at least a portion of the spin carrying current carriers between different predetermined ranges of angles; thereby to provide a spin switch device.

34. A device for manipulating a direction of motion of current carriers, the device comprising
a structure containing a two-dimensional gas of the current carriers configured to create at least one region of inhomogeneity in the form of a transition region between two regions of the gas characterized by a substantially varying value of a spin-orbit coupling constant or characterized by a substantially varying value of density of the spin carrying current carriers provided the spin-orbit coupling constant is of non-zero value,
said region of inhomogeneity presenting a lateral interface with laterally varying parameters between the two gas regions;
the structure being configured to provide a desired orientation between an input flux of unpolarized spin-carrying current carriers and said at least one region of inhomogeneity,
the device being thereby configured and operable as a spin filter for producing a current of spin carriers having a predetermined spin polarization.

35. A device for manipulating a direction of motion of current carriers, the device comprising
a structure containing a two-dimensional gas of the current carriers configured to create at least one region of inhomogeneity in the form of a transition region between two regions of the gas characterized by a substantially varying value of a spin-orbit coupling constant or characterized by a substantially varying value of density of the spin carrying current carriers provided the spin-orbit coupling constant is of non-zero value,
said region of inhomogeneity presenting a lateral interface with laterally varying parameters between the two gas regions;
the structure being configured to provide a desired orientation between an input flux of unpolarized spin-carrying current carriers and said at least one region of inhomogeneity,
the device being therefore configured and operable as a spin polarization splitter.

36. A device for manipulating a direction of motion of current carriers, the device comprising
a structure containing a two-dimensional gas of the current carriers configured to create at least one region of inhomogeneity in the form of a transition region between two regions of the gas characterized by a substantially varying value of a spin-orbit coupling constant or characterized by a substantially varying value of density of the spin carrying current carriers provided the spin-orbit coupling constant is of non-zero value,
said region of inhomogeneity presenting a lateral interface with laterally varying parameters between the two gas regions;
the structure being configured to provide a desired orientation between an input flux of spin-carrying current carriers and said at least one region of inhomogeneity,
said at least one region of inhomogeneity of the gas being configured for redirecting the spin carrying current carriers, thereby to provide a spin focusing of the spin carrying current carriers.

37. A device for manipulating a direction of motion of current carriers, the device comprising
a structure containing a two-dimensional gas of the current carriers configured to create at least one region of inhomogeneity in the form of a transition region between two regions of the gas characterized by a substantially varying value of a spin-orbit coupling constant or characterized by a substantially varying value of density of the spin carrying current carriers provided the spin-orbit coupling constant is of non-zero value,
said region of inhomogeneity presenting a lateral interface with laterally varying parameters between the two gas regions;
the structure being configured to provide a desired orientation between an input flux of spin-carrying current carriers and said at least one region of inhomogeneity,
said at least one region of inhomogeneity of the gas being configured for guiding the spin polarized spin carrying current carriers along said region of inhomogeneity of the gas owing to the total internal reflection of the spin carrying current carriers to convey the spin current to a predetermined location in the device, to thereby provide a spin guide.

38. A device for manipulating a direction of motion of current carriers, the device comprising
a structure containing a two-dimensional gas of the current carriers configured to create at least one region of inhomogeneity in the form of a transition region between two regions of the gas characterized by a substantially varying value of a spin-orbit coupling constant or characterized by a substantially varying value of density of the spin carrying current carriers provided the spin-orbit coupling constant is of non-zero value,
said region of inhomogeneity presenting a lateral interface with laterally varying parameters between the two gas regions;
the structure being configured to provide a desired orientation between an input flux of spin-carrying current carriers and said at least one region of inhomogeneity,
said at least one region of inhomogeneity of the gas being configured in the shape of a closed loop having an entrance and at least one exit for guiding the spin polarized spin carrying current carriers along said, region of inhomogeneity owing to the total internal reflection of the spin carrying current carriers, to thereby provide a spin storage of the spin carrying current carriers.

39. A device for manipulating a direction of motion of current carriers, the device comprising
a structure containing a two-dimensional gas of the current carriers configured to create at least one region of inhomogeneity in the form of a transition region between two regions of the gas characterized by a substantially varying value of a spin-orbit coupling constant or characterized by a substantially varying value of density of the spin carrying current carriers provided the spin-orbit coupling constant is of non-zero value,
said region of inhomogeneity presenting a lateral interface with laterally varying parameters between the two gas regions;

the structure being configured to provide a desired orientation between an input flux of spin-carrying current carriers and said at least one region of inhomogeneity, and comprising a gate configured for altering a bias voltage being sufficient to affect said inhomogeneous two-dimensional gas of spin carrying current carriers, said bias voltage being applied to the gate for switching deviation angles of at least a portion of the spin carrying current carriers between different predetermined ranges of angles;

thereby to provide a spin switch device.

* * * * *